(12) United States Patent
Hoshino

(10) Patent No.: US 8,130,125 B2
(45) Date of Patent: Mar. 6, 2012

(54) A/D CONVERTER, SOLID-STATE IMAGE CAPTURING APPARATUS AND ELECTRONIC INFORMATION DEVICE

(75) Inventor: Kozo Hoshino, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 126 days.

(21) Appl. No.: 12/802,471

(22) Filed: Jun. 8, 2010

(65) Prior Publication Data

US 2010/0315540 A1     Dec. 16, 2010

(30) Foreign Application Priority Data

Jun. 15, 2009 (JP) ................................. 2009-142491

(51) Int. Cl.
*H03M 1/00* (2006.01)

(52) U.S. Cl. ........................................ 341/122; 341/155

(58) Field of Classification Search .................. 341/122, 341/155, 156; 348/296, 297
See application file for complete search history.

(56) References Cited

U.S. PATENT DOCUMENTS

| | | | |
|---|---|---|---|
| 6,999,120 B1 * | 2/2006 | Egawa et al. | 348/296 |
| 2008/0198049 A1 * | 8/2008 | Maruyama | 341/122 |
| 2009/0073293 A1 * | 3/2009 | Yaffe et al. | 348/297 |
| 2009/0079603 A1 * | 3/2009 | Maruyama | 341/122 |

FOREIGN PATENT DOCUMENTS

| | | |
|---|---|---|
| JP | 2000-286706 A | 10/2000 |
| JP | 2007-243265 A | 9/2007 |
| JP | 2008-211540 A | 9/2008 |

* cited by examiner

*Primary Examiner* — Jean B Jeanglaude

(74) *Attorney, Agent, or Firm* — Edwards Wildman Palmer LLP; David G. Conlin; David A. Tucker

(57) ABSTRACT

The CMOS image sensor according to the present invention includes a sample hold section 3A1 for retaining an analog input signal voltage and a ramp wave signal voltage; and a comparing section 3A2 for taking an output from the sample hold section 3A1 as an input to compare it with a reverse level of itself, in which the sample hold section 3A1 applies a stabilization promoting voltage to a terminal of the sampling capacitance element so that an electric potential level of the terminal of the sampling capacitance element is promoted to become stabilized at a predetermined voltage, when the analog input signal is applied to the terminal of the sampling capacitance element.

20 Claims, 15 Drawing Sheets

US 8,130,125 B2

A/D CONVERTER, SOLID-STATE IMAGE CAPTURING APPARATUS AND ELECTRONIC INFORMATION DEVICE

This nonprovisional application claims priority under 35 U.S.C. §119(a) to Patent Application No. 2009-142491 filed in Japan on Jun. 15, 2009, the entire contents of which are hereby incorporated by reference.

BACKGROUND OF THE INVENTION

1. Field of the Invention

The present invention relates to an A/D converter, a solid-state image capturing apparatus, and an electronic information device, and more particularly, to an A/D converter for converting an analog signal to digital data, a solid-state image capturing apparatus including the A/D converter, and an electronic information device including the solid-state image capturing apparatus used therein. The present invention is on the basis of the underlying technology of column-parallel A/D converters, in which a sample hold section and a comparing section are arranged for each column, and which are used for CCD and CMOS image sensors, near-infrared and far infrared image sensors and the like, in which an element for converting energy into an electron, including a photoelectric conversion element, is defined to be one unit pixel and the plurality of pixels are arranged in rows and columns.

2. Description of the Related Art

In solid-state image capturing apparatuses including recent CMOS image sensors, a complicated analog circuit and digital circuit as well as a signal processing unit can be equipped on a CMOS image sensor chip owing to the merging of a CMOS logic process and an image sensor process. Further, some solid-state image capturing apparatuses include an A/D converter equipped on a sensor chip.

The architecture of A/D converters particularly used in solid-state image capturing apparatuses includes the configuration of column-parallel A/D converters.

Column-parallel A/D converters are the kind of A/D converters in which, substantial parts (e.g., a sample hold section and a comparing section) of the A/D converters are provided for each column of solid-state image capturing elements (referred to as "pixels" hereinafter) that are arranged in rows and columns. Such A/D converters are advantageous in that they can reduce a conversion rate to a read out rate for one row to reduce its overall power consumption, and that it is easy to increase the read out rate.

Among such column-parallel A/D converters, those with a system of using a ramp wave signal are commonly used. In a case of a resolution of 10 bit accuracy, A/D converters with this system use a system, in which the level of a ramp wave signal is incrementally increased (or decreased) at a 1024 step, and simultaneously count-up (or count-down) is performed by a counter circuit to store a counter value at the time when the output of a comparator is reversed, in a digital memory as digital pixel data of an analog pixel signal, the comparator being for comparing a ramp wave signal level with a pixel signal level.

FIG. 11 is a system configuration diagram of a solid-state image capturing apparatus, such as a CMOS image sensor, represented in Reference 1.

A solid-state image capturing apparatus 200a illustrated in FIG. 11 includes: a plurality of pixels 200 arranged in rows and columns; a vertical decoder circuit 201 for selecting each pixel row; a sample hold circuit and comparing circuit section 4A (also abbreviated as SHC circuit section, hereinafter) for sample holding an analog pixel signal from each pixel column and comparing the signal with a ramp waveform; and a ramp wave generating circuit 202 for generating the ramp waveform. The solid-state image capturing apparatus 200a further includes: a counter circuit 203 for generating an N-bit count value; a digital memory circuit (N-bit) 206 for receiving the N-bit count value and storing the N-bit count value as digital pixel data corresponding to the analog pixel signal described above in accordance with a comparison output from the SHC circuit section 4A; and a horizontal decoder circuit 204 for controlling the digital memory circuit 206 so that digital pixel data stored in each digital memory circuit 206 is successively output.

In addition, FIG. 12 is a diagram describing a column-parallel A/D converter with a conventional technique, which is included in the aforementioned solid-state image capturing apparatus. FIG. 12 illustrates a sample hold circuit and comparison circuit section consisting of capacitances and switches, in the column-parallel A/D converter, along with a pixel circuit constituting a pixel.

One of the inputs to the SHC circuit section 4A is an input signal Vpix from the pixels, and another input is an output signal Vr from the ramp wave generating circuit 202. The ramp wave generating circuit 202 is a circuit for generating a ramp wave to be compared with a difference voltage ΔV between a reset level Vrst and a signal level Vsig, which varies in accordance with the amount of light.

In addition, the pixel 200 is constituted of a pixel circuit 4B. The pixel circuit 4B includes: a photodiode PD for photoelectrically converting incident light; an electric charge accumulating section (floating diffusion) FD for accumulating a signal charge obtained by the photoelectric conversion by the photodiode PD; a transfer transistor Tt for transferring the signal charge from the photodiode PD to the electric charge accumulating section FD; a reset transistor Tr connected between a power source VD and the electric charge accumulating section FD for resetting an electric potential of the electric charge accumulating section FD to a source voltage; an amplifying transistor Ta for amplifying the electric potential of the electric charge accumulating section FD; and a selecting transistor Ts connected between the amplifying transistor Ta and a read out signal line L (also referred to as a pixel signal line, hereinafter) for selecting a pixel. A gate of the reset transistor Tr is input a pixel reset signal RST, a gate of the transfer transistor Tt is input a transfer signal TX, and a gate of the selecting transistor Ts is input a horizontal line selecting signal SEL.

The read out signal line L is provided for each pixel column, and is connected to a constant current source 403. In addition, an analog pixel signal being read by the read out signal line L is supplied to the SHC circuit section 4A functioning as a sample hold circuit and a comparing circuit.

As illustrated in FIG. 12, the SHC circuit section 4A includes: a switch (SW1) 401a connected between a first node N41 and the read out signal line L in the SHC circuit section 4A; a first capacitance element (C1) 402a connected between the first node N41 and a second node N42 in the circuit section; a second switch (SW2) 401b and a second capacitance element (C2) 402b connected in series between the first node N41 and a ramp waveform input node Nr; a comparing circuit 400 connected between the second node N42 and an output node (CPOUT) Ncp; and a third switch (SW3) 401c connected in parallel with the comparing circuit 400. The first to third switches 401a to 401c are controlled to be turned on and off by control signals SW1 to SW3.

The SHC circuit section 4A herein includes a sample hold circuit 4A1 and a comparing circuit 4A2. The sample hold circuit 4A1 is constituted of the two switches 401a and 401b as well as the two capacitance elements 402a and 402b. In addition, the comparing section 4A2 is constituted of the comparing circuit 400 and the third switch 401c.

In the solid-state image capturing apparatus 200a, in addition, the SHC circuit section 4A, the digital memory circuit 206, the counter circuit 203; and the ramp wave generating circuit 202 constitute the A/D converter 220a.

It is noted herein that the first to third switches (SW1 to SW3) 401a to 401c are controlled by the control signals SW1 to SW3 and these control signals are supplied from a controlling section 210 together with a pixel driving signal, for explanatory reasons.

Next, the operation will be described.

FIG. 13 is a diagram illustrating a level change in respective driving signals SEL, RST and TX for driving pixels; a level change in respective control signals SW1 to SW3 for controlling the SHC circuit section (sample hold circuit and comparing circuit) 4A; and a voltage change of the input signal Vpix from the pixels.

First, at a time t1, the horizontal line selecting signal SEL is turned on, the horizontal line selecting signal SEL being a pixel driving signal, and simultaneously, the pixel reset signal RST is turned on. As a result, the electric potential level of the floating diffusion FD of a pixel is pulled up to the pixel power source VD, and simultaneously, the voltage of the pixel signal Vpix, that is, the voltage of the read out signal line L connected to the selected pixel, is also increased.

Next, at a time t2, the switch 401a, for controlling the input of the pixel signal Vpix to the sample hold circuit, and the auto-zero switch 401c of the comparing circuit are turned on by the respective control signals SW1 and SW3. The voltage level of the pixel signal Vpix is slightly decreased owing to the influence of feedthrough upon turning on these switches.

At a time t3, the pixel reset signal RST is turned off, so that the voltage of the pixel signal Vpix is settled to the reset level Vrst for the pixel by the first sampling capacitance 402a (capacitance value C1) in the sample hold circuit 4A1, an additional capacitance of the readout signal line L, and an amplification operation of a source follower circuit, which is constituted of a transistor and a constant current source in the pixel.

At a time t4, the auto-zero switch 401c of the comparing circuit is turned off, so that a voltage difference between the reset level Vrst for the pixel and a reverse level Vth for the comparing circuit is retained in the first sampling capacitance 402a. Herein, the reverse level Vth for the comparing circuit is a threshold voltage of the comparing circuit.

Next, at a time t5, the transfer gate (transfer transistor) Tt of the pixel is turned on, so that an electric charge is transferred from the photodiode PD to the floating diffusion FD, and the voltage of the floating diffusion FD is decreased. However, during a dark period as illustrated in FIG. 13, the voltage of the floating diffusion FD is increased owing to capacitance coupling of the transfer gate (the gate of the transfer transistor) and the floating diffusion FD, and the voltage of the pixel signal Vpix is increased simultaneously.

At a time t6, the transfer gate (transfer transistor) Tr is turned off, so that the voltage of the pixel signal Vpix is decreased. At a time t7, the switch 401b is turned on, the switch 401b being for controlling the input of the ramp wave signal Vr of the sample hold circuit 4A1, so that the voltage of a terminal Nb' is decreased and the voltage of the pixel signal Vpix is decreased simultaneously, the terminal Nb' being one terminal of the second sampling capacitance 402b, which is connected to the switch 401b.

Thereafter, as similar to the aforementioned reset sampling period Trs, the voltage of the pixel signal Vpix is settled to the signal level Vsig by a capacitance value C2 of the second sampling capacitance 402b, an additional capacitance of the read out signal line L, and an amplification operation of a source follower circuit, which is constituted of a transistor and a constant current source in the pixel.

At a time t8, the switch 401a is turned off, the switch 401a controlling the input of the pixel signal Vpix to the sample hold circuit, so that the second sampling capacitance 402b is retained a voltage difference between the pixel signal level Vsig and an initial level Vr0 of the ramp wave.

Finally, at a time t9, the horizontal line selecting signal SEL is turned off, the horizontal line selecting signal SEL being a pixel driving signal, so that the pixel signal Vpix is increased to return to the initial voltage level.

At this stage, an input voltage Vin of the comparing circuit 400 (e.g., an inverter) is observed to be Vin=Vrmp+(Vsig−Vr0)−(Vrst−Vth).

Herein, the Vrmp denotes a voltage level of a ramp waveform, and the Vr0 denotes an initial voltage level of the ramp waveform.

When this equation is transformed, the following equation can be obtained:

Vin=Vth−(Vrst−Vsig)+(Vrmp−Vr0).

That is, the input voltage Vin of the comparing circuit 400 is the sum of the threshold voltage Vth, the electric potential difference—(Vrst−Vsig), in which input voltage is sampled at two points of time, and the variation width of a reference voltage (Vrmp−Vr0). When the difference is zero between the variation width of a reference voltage (Vrmp−Vr0) and the electric potential difference (Vrst−Vsig), the relationship of Vin=Vth (threshold value voltage) is established and the output of the comparing circuit can be reversed.

When the difference is zero between the variation width of a ramp waveform voltage (Vrmp−Vr0) and the electric potential difference (Vrst−Vsig), it means that (Vrmp−Vr0)−(Vrst−Vsig)=0, and it can be expressed as (Vrst−Vsig)=(Vrmp−Vr0).

When the output of the comparing circuit is reversed, a count value of the counter circuit 203 is latched in the digital memory circuit 206. The counter output latched in the digital memory circuit 206 is output from the solid-state image capturing apparatus as digital pixel data of an analog pixel signal.

A reset sampling period Trs denotes a period of time from when the switch 401c is turned on to when it is turned off. A signal sampling period Tss denotes a period of time from when the switch 401b is turned on to when the switch 401a is turned off. In a case where the reset sampling period Trs and the signal sampling period Tss are sufficiently long, the sample hold circuit 4A1 in the column-parallel A/D converter samples a voltage level after the input signal (pixel signal) Vpix is stabilized from the pixel. As a result, it becomes possible to perform an A/D conversion on a difference voltage of a reset voltage and a signal voltage at accurate dark and bright periods.

On the contrary, as illustrated in the timing diagram of FIG. 13, in a case where the reset sampling period Trs and the signal sampling period Tss are both extremely short for the pixel signal Vpix in the A/D converter of the conventional technique, the sampling of the pixel signal Vpix is performed in the sample hold circuit 4A1 while the pixel signal Vpix is not sufficiently settled.

Reference 1: Japanese Laid-Open Publication No. 2000-286706

SUMMARY OF THE INVENTION

In the case of the aforementioned conventional technique as described above, the time until the input signal Vpix from the pixel is stabilized is determined by: the amplification operation of a source follower circuit, which is constituted of a transistor and a constant current source in a pixel, a parasitic capacitance (load capacitance) with respect to the input signal (Vpix) from a pixel represented by a non-selected pixel; and each sampling capacitance and the like in the sample hold circuit in the column-parallel A/D converter.

Therefore, in order to settle the pixel signal Vpix in a short period of time, there are some options, such as increasing the current of a constant current source, decreasing a load capacitance represented by a non-selected pixel on a pixel side, or decreasing a capacitance value of a sampling capacitance on a sample hold circuit side.

In a case of increasing the current of the constant current source, as illustrated in FIG. 15, the absolute value of the voltage level of the pixel signal Vpix decreases through the entire range of luminous intensities, and the absolute value of the voltage level does not decrease below the voltage range necessary for the constant current source. This causes a problem of narrowing a voltage range which can secure linearity of the sample level of the pixel signal Vpix.

The graph (a) in FIG. 15 illustrates change in a pixel signal voltage Vpix with respect to luminance in a case with a small current of the constant current source, whereas the graph (b) in FIG. 15 illustrates change in a pixel signal voltage Vpix with respect to luminance in a case with a large current of the constant current source. The electric potential difference (d) in FIG. 15 illustrates a voltage range of a pixel signal line necessary for the constant current source. In a case with a large current of the constant current source, actual change in the pixel signal voltage Vpix with respect to luminance has a feature as illustrated with a dotted line graph (c) in FIG. 15. In the area where a luminous intensity is larger than a certain value, the pixel signal voltage Vpix does not change with the change in the luminous intensity, which spoils linearity.

Japanese Laid-Open Publication No. 2008-211540 introduces a technique for switching current values of a constant current source in accordance with various driving modes.

This technique is for setting a constant current source to a large amount of current at a fast read out mode to settle a pixel signal in a short period of time, and for setting a constant current source to a small amount of current at a slow read out mode to settle a pixel signal in a long period of time. However, in the technique, it is not possible to read out a pixel signal at a fast rate and at the same time keep a current value of the constant current source low.

Moreover, another problem occurs, where thermal noise (kT/C noise) increases owing to heat resulted from the increase in current consumption. In a case where a capacitance value of a sampling capacitance is decreased on the aforementioned sample hold circuit side, a problem occurs as well, where the kT/C noise is increased to influence picture quality.

In the meantime, as an example of a method for decreasing a load capacitance represented by a non-selected pixel on the aforementioned pixel side, Japanese Laid-Open Publication No. 2007-243265 introduces a technique for reducing a load capacitance by half with a configuration of separating the load of one column of pixels into two columns and providing a switch for selecting either of the two columns. With the technique disclosed in the publication, however, it is necessary to arrange adjacent pixels by shifting them in a row or column direction. As a result, while the reading rate of the pixel signal is increased and its frame rate is improved, a new weak point newly arises, where a layout area is increased for attaining the number of necessary pixels.

In addition to the above-mentioned problem, there is another problem with regard to reading a pixel signal at a fast rate. A difference voltage ($\Delta V$) between a reset level (Vrst) of an input signal Vpix from a pixel and its signal level (Vsig) that changes in accordance with the amount of light does not accurately reach a value in accordance with the amount of light.

More particularly, being dependent on the amount of light of a pixel that was read out in a previous time, the voltage of the terminal Na' (internal node N41) on one terminal of the first capacitor 402a and the voltage of the connecting terminal Nb' of the switch 401b to the second capacitor 402b in FIG. 12 are retained in a voltage stage that was changed in a previous read out.

Thus, upon a present read out, an initial voltage of a pixel signal (voltage between terminals at the beginning of charging in a capacitor) is changed owing to a charge share between different electric potentials in a capacitor. Thus, its settling time is changed, resulting in causing a problem of not being able to retain an accurate voltage level when sampling is performed in a short period of time.

Hereinafter, this problem will be discussed in detail.

FIG. 14 is a diagram illustrating detailed waveforms of a pixel signal Vpix in the conventional, technique.

In FIG. 14, a waveform (A') represents a waveform of a case where a previous pixel read out was during a dark period and a present pixel read out is also during a dark period. Further, a waveform (B') in FIG. 14 represents a waveform of a case where a previous pixel read out was during a bright period and a present pixel readout is during a dark period. When the waveforms (A') and (B') of the pixel signal Vpix are compared with each other, the voltage of the waveform (B') is lower both during the sampling of the reset level Vrst and during the sampling of the signal level Vsig, which means that the settling is more or less better in a case where a previous pixel read out was during a bright time. Furthermore, when there is a difference between the settling of the reset sampling period and the settling of the signal sampling period, the difference voltage ($\Delta V$) is different in each case with the waveforms (A') and (B'), which results in different digital values as a result of an A/D conversion even though the present pixel read out is during the dark period with the same amount of light.

Similarly, in FIG. 14, the waveform (C') represents a waveform of a case where a previous pixel read out was during a dark period and a present pixel read out is during a bright period. The waveform (D') represents a waveform of a case where a previous pixel read out was during a bright period and a present pixel read out is also during a bright period. When the waveforms (C') and (D') of the pixel signal Vpix are compared with each other, the voltage of the waveform (D') is lower both during the sampling of the reset level Vrst and during the sampling of the signal level Vsig, which means that that the settling is more or less better in a case where a previous pixel read out was during a bright time. Furthermore, when there is a difference between the settling of the reset sampling period and the settling of the signal sampling period, the difference voltage ($\Delta V$) is different in each case with the waveforms (C') and (D'), which results in different digital values as a result of an A/D conversion even though a present pixel read out is during the bright period of the same amount of light as a previous pixel read out.

The above-discussed problem is an essential problem to be solved from a viewpoint of the original objective of image sensors, which accurately convert light into a digital value through a voltage value of the pixel signal Vpix.

The present invention is intended to solve the conventional problems described above. The objective of the present invention is to provide: a solid-state image capturing apparatus capable of shortening a sampling period of a reset level and a sampling period of a signal level to shorten a total pixel read out period, thereby performing an A/D conversion on light accurately at a fast frame rate, without largely increasing an area with respect to a sensor chip and while maintaining a low noise picture quality; and an electronic information device including the solid-state image capturing apparatus used therein.

An A/D converter according to the present invention includes a comparing section for comparing a voltage level of an analog input signal with a voltage level of a ramp wave signal incrementally changing by a constant voltage range, for converting the voltage level of the analog input signal into digital data on the basis of a comparison result of the comparing section, and the A/D converter further includes a sample hold section, which includes at least one capacitance element as a sampling capacitance element, and is configured so that, when the analog input signal is applied to a terminal of the sampling capacitance element, the voltage level of the analog input signal is sample held by the sampling capacitance element, where the sample hold section applies a stabilization promoting voltage to the terminal of the sampling capacitance element so as to promote a stabilization in which an electric potential level of the terminal of the sampling capacitance element is stabilized towards a predetermined voltage when the analog input signal is applied to the terminal of the sampling capacitance element, thereby achieving the objective described above.

Preferably, in an A/D converter according to the present invention, the sample hold section includes at least two capacitance elements as first and second sampling capacitance elements, and is configured such that a first voltage level of the analog input signal is sample held by the first sampling capacitance element when the analog input signal is applied to a terminal of the first sampling capacitance element, and a second voltage level of the analog input signal is sample held by the second sampling capacitance element when the analog input signal is applied to a terminal of the second sampling capacitance element; the comparing section is configured to compare a difference voltage level between the first voltage level and the second voltage level of the analog input signal with the voltage level of the ramp wave signal; the digital data is obtained by performing A/D conversion on the difference voltage level; and when the analog input signal is applied to a terminal of at least one of the first and second sampling capacitance elements of the sample hold section, the stabilization promoting voltage is applied to the terminal of the at least one sampling capacitance element so that the electric potential level of the at least one terminal of the sampling capacitance element is promoted to become stabilized.

Still preferably, in an A/D converter according to the present invention, the analog input signal is an analog pixel signal from a pixel, which constitutes a solid-state image capturing apparatus and which performs a photoelectric conversion on and outputting light from a subject; and the first voltage level of the analog input signal is a reset voltage level, which is a reference electric potential of the pixel, and the second voltage level of the analog input signal is a signal voltage level obtained by the photoelectric conversion in the pixel.

Still preferably, in an A/D converter according to the present invention, when the analog input signal is applied to a terminal of the first sampling capacitance element of the sample hold section, a first initial voltage, as the stabilization promoting voltage, is applied to the terminal of the first sampling capacitance element so that the electric potential level of the terminal of the first sampling capacitance element is promoted to become stabilized to the reset voltage level.

Still preferably, in an A/D converter according to the present invention, when the analog input signal is applied to a terminal of the second sampling capacitance element of the sample hold section, a second initial voltage, as the stabilization promoting voltage, is applied to the terminal of the second sampling capacitance element so that the electric potential level of the terminal of the second sampling capacitance element is promoted to become stabilized to the signal voltage level.

Still preferably, in an A/D converter according to the present invention, when the analog input signal is applied to a terminal of the first sampling capacitance element of the sample hold section, a first initial voltage, as the stabilization promoting voltage, is applied to the terminal of the first sampling capacitance element so that the electric potential level of the terminal of the first sampling capacitance element is promoted to become stabilized to the reset voltage level; and when the analog input signal is applied to a terminal of the second sampling capacitance element of the sample hold section, a second initial voltage, as the stabilization promoting voltage, is applied to the terminal of the second sampling capacitance element so that the electric potential level of the terminal of the second sampling capacitance element is promoted to become stabilized to the signal voltage level.

Still preferably, in an A/D converter according to the present invention, the sample hold section is a sample hold circuit for retaining a voltage level of the analog input signal to be converted into the digital data and a ramp wave signal voltage incrementally changing in level at a step corresponding to a bit number in the digital data.

Still preferably, in an A/D converter according to the present invention, the comparing section is a single input comparing circuit for taking, as an input, only an output from the sample hold circuit to compare the input with a threshold value of the section itself.

Still preferably, in an A/D converter according to the present invention, the comparing section is a two input comparing circuit for taking an output from the sample hold circuit and the ramp wave signal voltage as inputs.

Still preferably, in an A/D converter according to the present invention, a first terminal of the first sampling capacitance element is an input node of the comparing section, and the sample hold section includes a first switch connected between a first initial voltage terminal, to which the first initial voltage is applied as the stabilization promoting voltage, and a second terminal of the first sampling capacitance element.

Still preferably, in an A/D converter according to the present invention, the stabilization promoting voltage applied to a second terminal of the first sampling capacitance element has a voltage value very close to a first voltage level, towards which the voltage level of the analog input signal is transitionally stabilized.

Still preferably, in an A/D converter according to the present invention, an on-period of the first switch is controlled such that the first switch is switched off when a voltage level of a second terminal of the first sampling capacitance element becomes a voltage value very close to a first voltage level, toward which the voltage level of the analog input signal is transitionally stabilized.

Still preferably, in an A/D converter according to the present invention, a first terminal of the second sampling capacitance element is an input terminal of the ramp wave signal, and the sample hold section includes a second switch connected between an input terminal applied with the analog input signal and a second terminal of the second sampling capacitance element.

Still preferably, an A/D converter according to the present invention further includes a third switch connected between a second initial voltage terminal applied with a second initial voltage as the stabilization promoting voltage, and the second terminal of the second sampling capacitance element.

Still preferably, in an A/D converter according to the present invention, the second initial voltage is set so that, when the second switch is switched on, the voltage level being stabilized after electric charge distribution, of the second terminal of the second sampling capacitance element becomes a voltage level very close to the transitionally stabilized first voltage level of the analog input signal.

Still preferably, in an A/D converter according to the present invention, the on-period of the third switch is controlled by switching off the third switch so that, when the second switch is switched on, a voltage level being stabilized after electric charge distribution, of the second terminal of the second sampling capacitance element becomes a voltage value very close to the transitionally stabilized first voltage level of the analog input signal.

Still preferably, in an A/D converter according to the present invention, a first initial voltage terminal for applying a first initial voltage to a second terminal of the first sampling capacitance element is fixed at a ground level.

Still preferably, in an A/D converter according to the present invention, a second initial voltage terminal for applying a second initial voltage to a second terminal of the first sampling capacitance element is fixed at a ground level.

A solid-state image capturing apparatus according to the present invention includes the A/D converter according to the present invention, thereby achieving the objective described above.

An electronic information device according to the present invention includes an image capturing section for capturing an image of a subject, where the image capturing section includes the solid-state image capturing apparatus according to the present invention, thereby achieving the objective described above.

The functions of the present invention will be described hereinafter.

In the present invention, merely by newly adding elements of two signal lines and three switches to a column-parallel A/D converter of the conventional technique, it becomes possible to perform settling in a dramatically shorter period of time compared with a setting time which is stabilized by an additional capacitance and a source follower amplification operation. As a result, it becomes possible to shorten a read out period for a pixel signal, thereby improving a frame rate while preventing the lowering of a pixel quality owing to thermal noise.

That is, in the present invention, an A/D converter retains an analog input signal voltage to be converted into digital data and a ramp wave signal voltage changing at a step corresponding to a bit number in the digital data, and converts the analog input signal voltage into digital data on the basis of a comparison result of the two retained voltages. The A/D converter includes a sampling capacitance element for sample holding a voltage level of the analog input signal, so that the A/D converter can perform in a short period of time settling of the voltage level with the sampling capacitance element by applying a predetermined initial voltage to the sampling capacitance element to cause it to prompt stabilizing of the voltage level of the analog input signal in the sampling capacitance element.

In the present invention, in a sample hold circuit constituting the A/D converter, the initial voltage applied to the sampling capacitance element is set to be a voltage value very close to a first voltage level held by the sampling capacitance element, so that by application of the initial voltage in the capacitance element, the voltage level of the analog input signal is compulsorily set to near a first voltage level to be held and is subsequently settled. That is, stabilization is made to the first voltage level to be held at a fast rate. Therefore, even if the sample hold circuit samples the voltage level of the analog input signal in a short period of time, the first voltage level is precisely sampled.

In the present invention, an on-period of a first switch is set to be variable, the on-period being for applying the first initial voltage to the first sampling capacitance element, and the first switch is controlled to be turned off when a voltage level of a terminal, applied with the initial voltage, of the first sampling capacitance element is at a voltage value very close to the transitionally stabilized first voltage level of the analog input signal. Thereby, optimization is enabled to sample hold the first voltage level of the analog input signal in a shorter period of time.

In the present invention, a second sampling capacitance element is included for sample holding a second voltage level of the analog input signal, and a second switch for applying the analog input signal to the capacitance element is also included. Thereby, the analog input signal can be applied independently to the first sampling capacitance element and the second sampling capacitance element.

In the present invention, a third switch is included for applying a second initial voltage to the second sampling capacitance voltage. Thereby, the settling of the second voltage level in the second sampling capacitance element can be prompted with the second initial voltage.

In the present invention, when the second switch is turned on, the voltage level of a terminal, applied with the analog input signal, of the second sampling capacitance element is a voltage value very close to the transitionally stabilized first voltage level of the analog input signal, the voltage level of the terminal being stabilized after electric charge distribution. Thus, when the second switch is turned on, the voltage level of a terminal, applied with the analog input signal, of the second sampling capacitance element is set to near the first voltage level and is subsequently settled. That is, stabilization is made to the first voltage level at a fast rate. Therefore, even if a period for the sample hold circuit to sample the second voltage level of the analog input signal is short, the second voltage level can be precisely sampled. The second voltage level mentioned herein is defined to be a voltage level equal to or below the first voltage level.

In the present invention, a period for the third switch to be turned on is set to be variable and the on-period of the third switch is controlled so that when the second switch is turned on, the voltage of a terminal of the second sampling capacitance element, applied with the analog input signal, becomes a voltage value very close to the first voltage level, which is transitionally stabilized, and the voltage level of the terminal of the second sampling capacitance element is stabilized after electric charge distribution when the second switch is turned on. Thereby, optimization is possible to sample hold the second voltage level of the analog input signal in a shorter period of time.

In the present invention, the terminal is fixed to aground, for applying the first initial voltage, with respect to the terminal, applied with the analog input signal, of the first sampling capacitance element, so that the first initial voltage is not necessary to be applied from the outside. As a result, a reference voltage generating circuit is not necessary for the first initial voltage, thereby achieving effects of reducing power consumption and reducing a layout area of the A/D converter.

In the present invention, the terminal is fixed to a ground for applying the second initial voltage fixed to the ground with respect to the terminal, the second initial voltage applied with the analog input signal of the sampling capacitance element, so that the second initial voltage is not necessary to be applied from the outside, as similar to the above description. As a result, a reference voltage generating circuit is not necessary for the second initial voltage, thereby achieving effects of reducing power consumption and reducing a layout area of the A/D converter.

According to the present invention, it is possible to obtain: an A/D converter capable of shortening a sampling period of each of a reset level and a signal level to shorten a total pixel read out period and accurately perform an A/D conversion on light at a fast frame rate, without largely increasing an area with respect to a sensor chip of the conventional technique and while maintaining a low noise picture quality; a solid-state image capturing apparatus, represented by a CMOS image sensor, including the A/D converter used therein; and an electronic information device including the solid-state image capturing apparatus used therein.

These and other advantages of the present invention will become apparent to those skilled in the art upon reading and understanding the following detailed description with reference to the accompanying figures.

Figure 1:
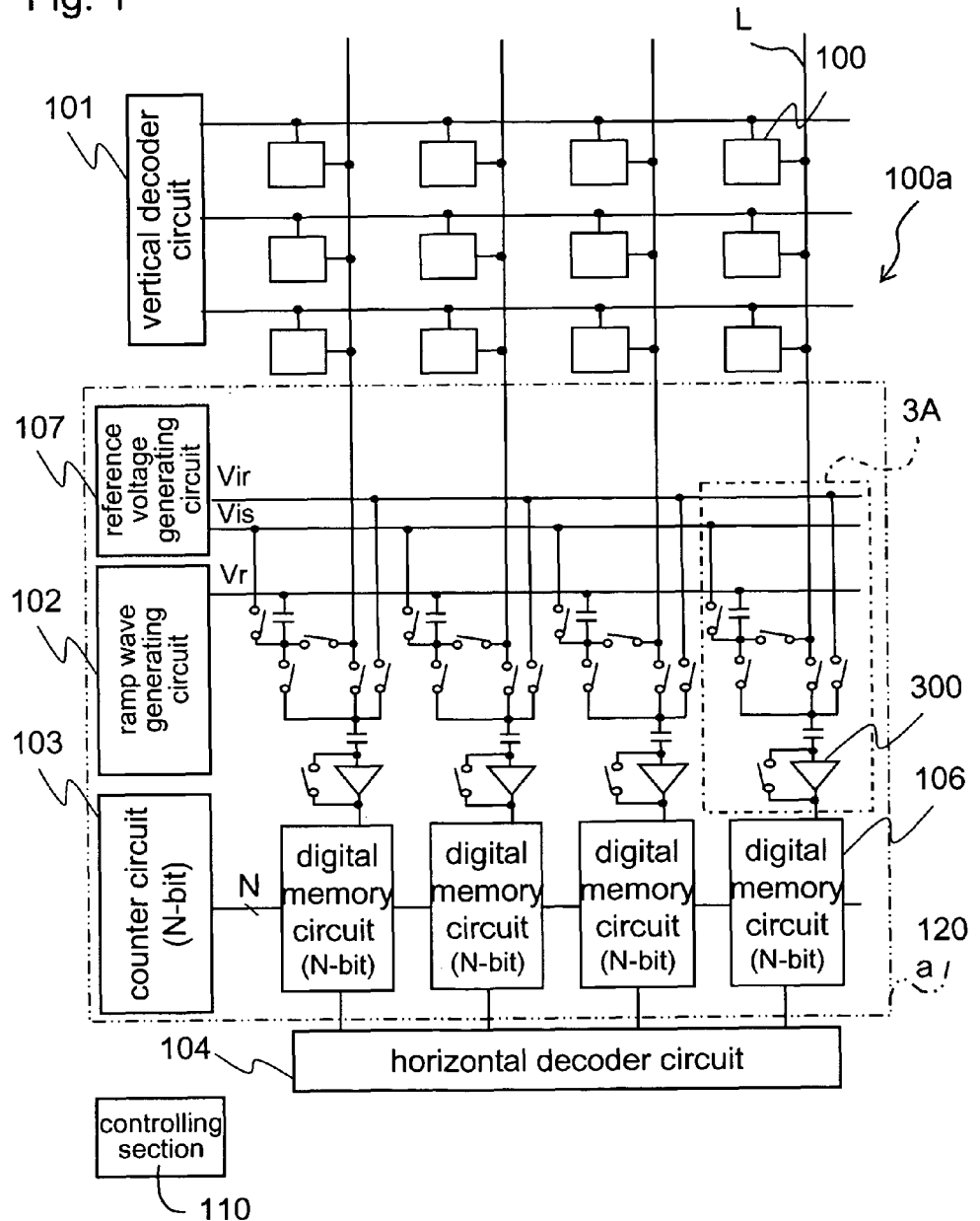
FIG. 1 is a diagram illustrating a system configuration of a CMOS image sensor including an A/D converter according to Embodiment 1 of the present invention.

100, 200 pixel
100a, 100b solid-state image capturing apparatus
101, 201 vertical decoder circuit
102, 202 ramp wave generating circuit
103, 203 counter circuit
104, 204 horizontal decoder circuit
105, 205 comparing circuit
106, 206 digital memory circuit
107 reference voltage generating circuit
303, 403, 1203 constant current source
3A, 4A, 12A sample hold circuit and comparing circuit section
300, 400, 1200 comparing circuit
301a, 301b, 301c,
301d, 301e, 301f,
401a, 401b, 401c,
1201a, 1201b, 1201c,
1201d, 1201e, 1201f switch
302a, 302b, 402a,
402b, 1202a, 1202b capacitance element
3A1, 12A1 sample hold circuit
3A2, 12A2 comparing section
3B, 12B pixel circuit

DESCRIPTION OF THE PREFERRED EMBODIMENTS

Hereinafter, embodiments of the present invention will be described with reference to the accompanying figures.

That is, an A/D converter and a solid-state image capturing apparatus including the A/D converter according to embodiments of the present invention will be described.

(Embodiment 1)

Figure 2:
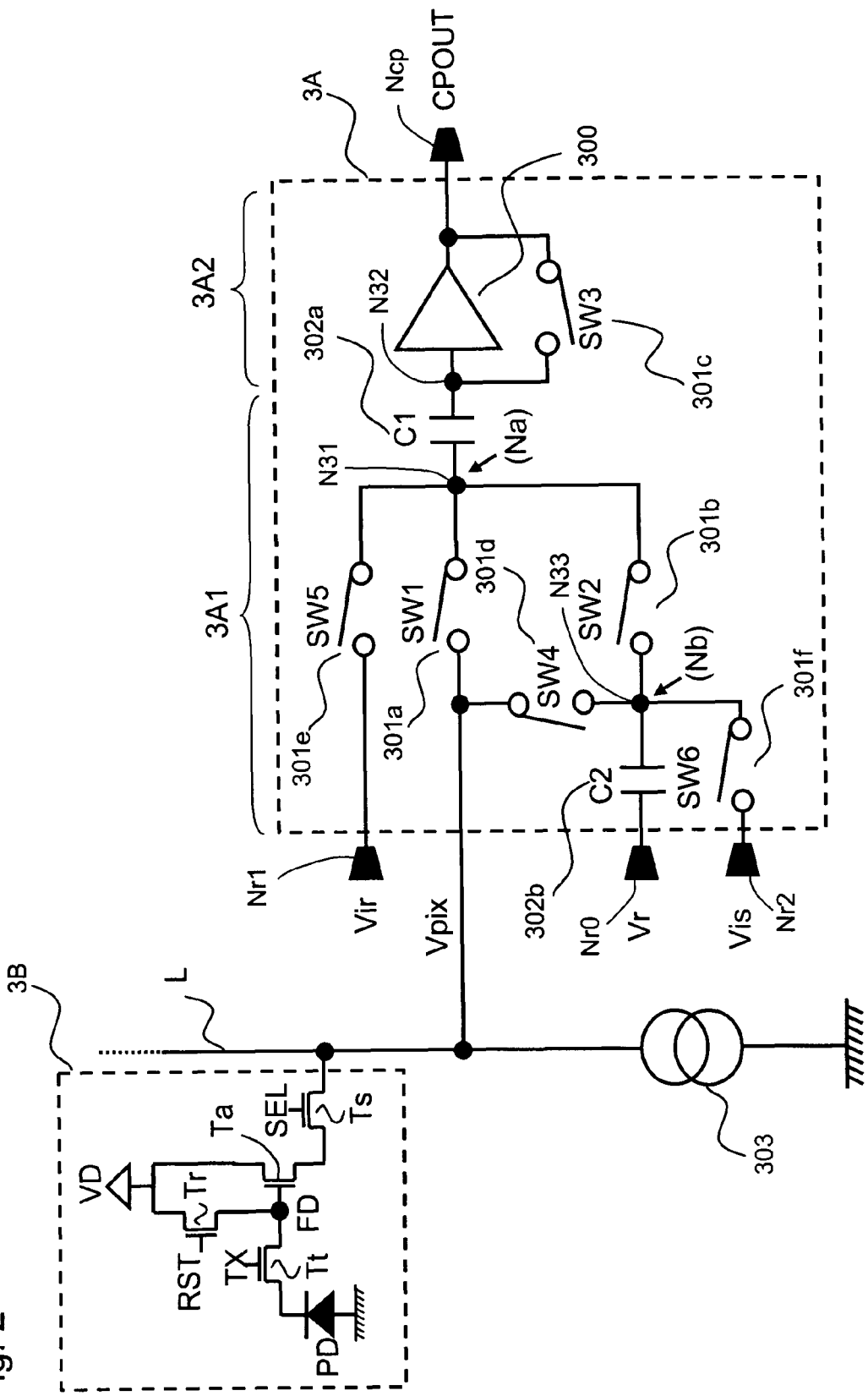
FIG. 2 is a diagram illustrating a sample hold circuit and comparing circuit section in the A/D converter according to Embodiment 1 of the present invention, together with a configuration of a pixel.

FIG. 1 is a diagram describing a system configuration of a CMOS image sensor including an A/D converter according to Embodiment 1 of the present invention. FIG. 2 is a diagram illustrating a sample hold circuit and comparing circuit section in the A/D converter according to Embodiment 1 of the present invention, together with a configuration of a pixel.

Note that, in Embodiment 1 and other embodiments described thereafter, unless a particular description is necessary, switches, comparing circuits and digital memory circuits will be turned into models to be illustrated in figures. Further, it is needless to say that the embodiments of the present invention will be limited to exemplary configurations of the CMOS image sensor illustrated hereinafter.

A CMOS image sensor 100a according to Embodiment 1 includes: a plurality of pixels 100 arranged in rows and columns; a vertical decoder circuit 101 for selecting a pixel row of the plurality of pixels 100 arranged in rows and columns; and a ramp wave generating circuit 102 for generating a ramp wave signal (Vr) used for an A/D conversion. Herein, an arrangement of 3 rows×4 columns is illustrated as the arrangement of the plurality of pixels; however, the number of pixels is limited in this arrangement for explanatory reasons and simplifying the figure. In actual devices, the number of pixels is set in a horizontal direction and a vertical direction in accordance with their use.

In the CMOS image sensor 100a according to Embodiment 1, each pixel 100 is constituted of a pixel circuit 3B. Similar to the conventional CMOS image sensor 200a, the pixel circuit 3B includes: a photodiode PD for photoelectrically converting incident light; an electric charge accumulating section (floating diffusion) FD for accumulating a signal charge obtained by the photoelectric conversion by the photodiode PD; a transfer transistor Tt for transferring the signal charge from the photodiode PD to the electric charge accumulating section FD; a reset transistor Tr connected between a power source VD and the electric charge accumulating section FD for resetting an electric potential of the electric charge accumulating section FD to a source voltage; an amplifying transistor Ta for amplifying the electric potential of the electric charge accumulating section FD; and a selecting transistor Ts connected between the amplifying transistor Ta and a read out signal line (pixel signal line) L for selecting a pixel. A gate of the reset transistor Tr is input a pixel reset signal RST, a gate of the transfer transistor Tt is input a transfer signal TX, and a gate of the selecting transistor Ts is input a horizontal line selecting signal SEL.

In addition, the CMOS image sensor 100a includes: a sample hold circuit 3A1 constituted of switches and capacitance elements; a reference voltage generating circuit 107 for generating two reference voltages Vir and Vis used by the sample hold circuit 3A1 to read out a signal from the pixel at a fast rate; a comparing circuit 300 for, as an input, taking only an output from the sample hold circuit; a digital memory circuit 106 compatible with the N-bits, for storing a state of "High" or "Low" of each bit signal output from an N-bit counter circuit 103 when a signal output from the comparing circuit 300 is changed; a horizontal decoder circuit 104 for selecting the digital memory circuit 106 in a column direction; and a controlling section 110 for controlling an A/D converter 120a and a pixel circuit 3B.

FIG. 2 is a diagram illustrating in detail a sample hold circuit and comparing circuit section in the A/D converter according to Embodiment 1 of the present invention.

A sample hold circuit and comparing circuit section 3A in the A/D converter according to Embodiment 1 illustrated in FIG. 2 includes a sample hold circuit 3A1 for sample holding a difference voltage between a reset level and a signal level, and a comparing section 3A2 for comparing the difference voltage and a ramp wave signal level.

Herein, the sample hold circuit 3A1 is constituted of two capacitance elements 302a and 302b (hereinafter, the respective capacitances will be referred to as C1 and C2) and five switches (SW1) 301a, (SW2) 301b, (SW4) 301d, (SW5) 301e and (SW6) 301f (hereinafter, control signals of the respective switches will be referred to as SW1, SW2, SW4, SW5 and SW6). In addition, the comparing section 3A2 is constituted of a chopper type single input comparing circuit 300 and a switch (SW3) 301c (hereinafter, a control signal of the switch will be referred to as SW3) for short-circuiting an input and output of the single input comparing circuit 300.

That is, the sample hold circuit 3A1 includes: a switch (first switch) 301a connected between a first internal node (Na terminal) N31 and the read out signal line L; a capacitor (first sampling capacitance element C1) 302a connected between the first internal node N31 and a second internal node N32; a switch (second switch) 301b connected between the first internal node N31 and a third internal node (Nb terminal) N33; a capacitor (second sampling capacitance element C2) 302b connected between the third internal node N33 and a ramp signal input terminal Nr0; a switch (sixth switch) 301f connected between the third internal node N33 and an input terminal Nr2 of a reference signal (second reference signal) Vis; a switch (fifth switch) 301e connected between the first internal node N31 and an input terminal Nr1 of a reference signal (first reference signal) Vir; and a switch (fourth switch) 301d connected between the third internal node N33 and the read out signal line L.

The comparing section 3A2 further includes: a single input comparing circuit 300 connected between the second internal node N32 and a comparison output node Ncp; and a switch (third switch) 301c connected in parallel with the comparing circuit 300.

The above-described switches 301a to 301f are controlled to be switched on and off by control signals SW1 to SW6.

In the solid-state image capturing apparatus 100a herein, the SHC circuit section 3A, digital memory circuit 106, counter circuit 103, ramp wave generating circuit 102 and reference voltage generating circuit 107 constitute the A/D converter 120a.

Herein, for explanatory reasons, the first to sixth switches (SW1 to SW6) 301a to 301f are controlled by the control signals SW1 to SW6, and these control signals are supplied from the controlling section 110 together with a driving signal for a pixel.

Next, the operation will be described.

The operation of the sample hold circuit and comparing circuit section (SHC circuit section) 3A illustrated in FIG. 2 will be described in detail with reference to a timing diagram of FIG. 3.

First, at a time t1, the horizontal line selecting signal SEL is turned on, the horizontal line selecting signal SEL being a pixel driving signal, and simultaneously, the pixel reset signal RST is turned on. As a result, the electric potential level of the floating diffusion (FD) of a pixel is pulled up to the pixel power source VD, and simultaneously, the voltage of the pixel signal Vpix is also increased. Up to this point, the operation is the same as that of the conventional technique.

Next, at a time t2, the switch (SW1) 301a for controlling the input of the pixel signal Vpix, of the sample hold circuit 3A1 and the auto-zero switch (SW3) 301c of the comparing section 3A2 are switched on. Further, at the same time, the switch (SW5) 301e for applying the initial voltage Vir for a pixel reset level and the switch (SW6) 301f for applying the initial voltage Vis for a pixel signal level are simultaneously switched on. Owing to the influence of feedthrough at that point, the voltage of the pixel signal Vpix is slightly decreased. The amount of the voltage decreased at this point is larger than that of existing circuits. Owing to the on-state of the pixel reset signal RST on the pixel circuit side and the on-state of both the switch (SW1) 301a and the switch (SW5) 301e, the amount of the voltage decreased is determined by the voltage which stabilizes by a function of lowering the pixel signal Vpix to the initial voltage Vir for a pixel reset level and a function of stabilizing the pixel signal Vpix by a source follower circuit occurring simultaneously.

Next, at a time t3, the reset signal RST of a pixel is turned off so that the floating diffusion FD is turned into a floating state, the floating diffusion FD being an input of a source follower circuit of the pixel. As a result, the pixel signal Vpix is steeply pulled down to the initial voltage Vir for a pixel reset level via the switches SW1 and SW5. Simultaneously, the floating diffusion FD is functioned to be stabilized rapidly owing to the electric potential level of the pixel signal Vpix and a parasitic capacitance between the pixel signal Vpix and the floating diffusion FD. The initial voltage Vir for a reset level described herein is defined to be a voltage that is slightly lower than a reset level Vrst, at which the pixel signal Vpix is finally stabilized during a reset level reading out period.

Figure 5:
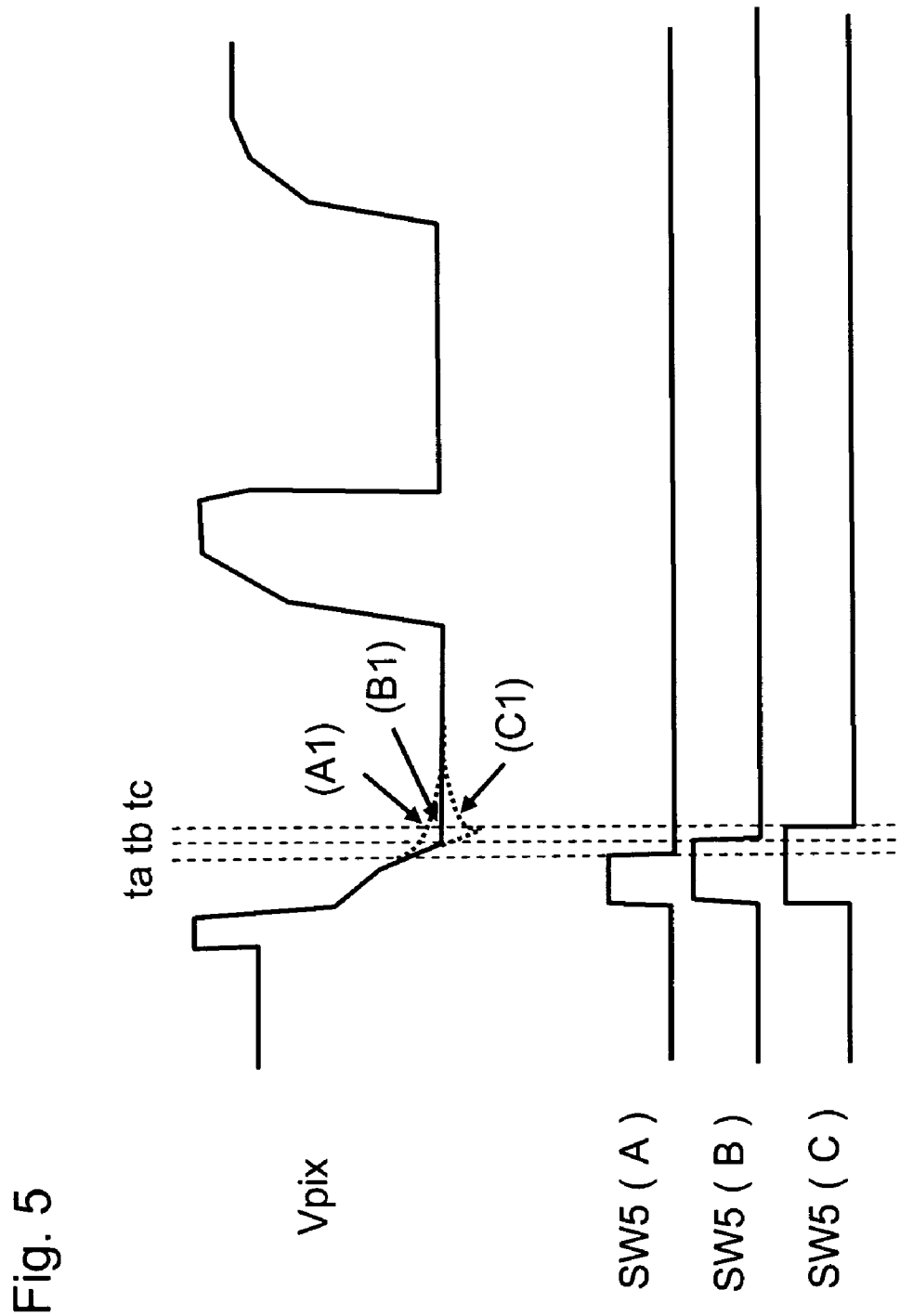
FIG. 5 is a diagram describing the A/D converter according to Embodiment 1 of the present invention, illustrating a relationship between a timing of a control signal for applying an initial voltage for a pixel reset level and a waveform of a pixel signal.

Further, at a time t4, the switch (SW5) 301e is switched off. At this point, the controlling of the switch (SW5) 301e for applying the initial voltage Vir for a pixel reset level is changed as illustrated in FIG. 5 with the switch control signals SW5 (A), SW5 (B) and SW5 (C), and the timing for turning them off is defined to be ta, tb and tc. As a result, the pixel signal Vpix is transitionally changed immediately before the level of the pixel signal Vpix is stabilized at a certain level, as in respective signal waveforms (A1), (B1) and (C1).

However, when the pixel signal voltage Vpix at which the switch SW5 is switched off at the off timing illustrated with the signal waveform (B1), is exactly equal to the pixel reset level Vrst, the switch SW5 is switched off in the signal waveform (A1) at a timing earlier than the off timing illustrated with the signal waveform (B1). As a result, the pixel signal voltage Vpix is changed gradually from the higher voltage side to the pixel reset level Vrst to be stabilized. In contrast, as the switch is switched off in the signal waveform (C1) at a timing later than the off timing illustrated with the signal waveform (B1), the pixel signal voltage Vpix is changed gradually from the lower voltage side to the pixel reset level Vrst to be stabilized.

In either case, the pixel signal voltage Vpix is once set to an initial voltage close to the pixel reset level Vrst and is subsequently settled, thereby stabilization is made to the pixel reset level Vrst in a very short period of time.

Next, at a time t5, the switch (SW6) 301f is switched off, the switch being for applying the initial voltage Vis for a pixel signal level to the second capacitance element 302b.

Figure 3:
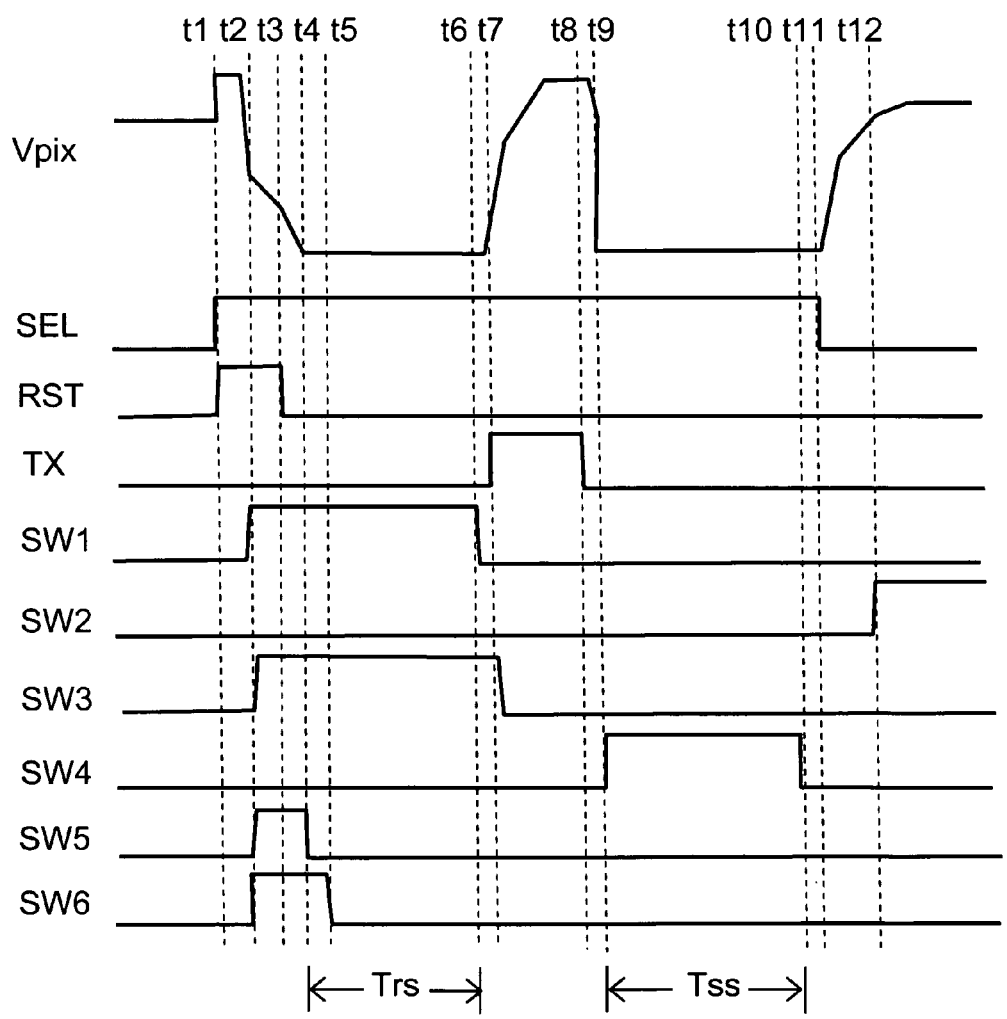
FIG. 3 is a diagram describing an operation of the pixel and the A/D converter according to Embodiment 1 of the present invention using a timing diagram.

In FIG. 3, the switch (SW6) 301f is switched off later than the off timing for the switch (SW5) 301e for applying the initial voltage Vir for a pixel reset level to a terminal (Na terminal) of the first capacitance 302a. However, the present invention is not limited to this.

During the on-period of the switch (SW6) 301f, both the switch (SW2) 301b and the switch (SW4) 301d are in an off state, the switch (SW2) 301b being for controlling the input of the ramp wave input and the switch (SW4) 301d being for controlling the input of the pixel signal Vpix during a period of sampling the pixel signal level Vsig. As a result, it is set to a state in which the initial voltage Vis for a pixel signal level is applied to the terminal Nb, which is one terminal of the second sampling capacitance (C2).

Figure 6:
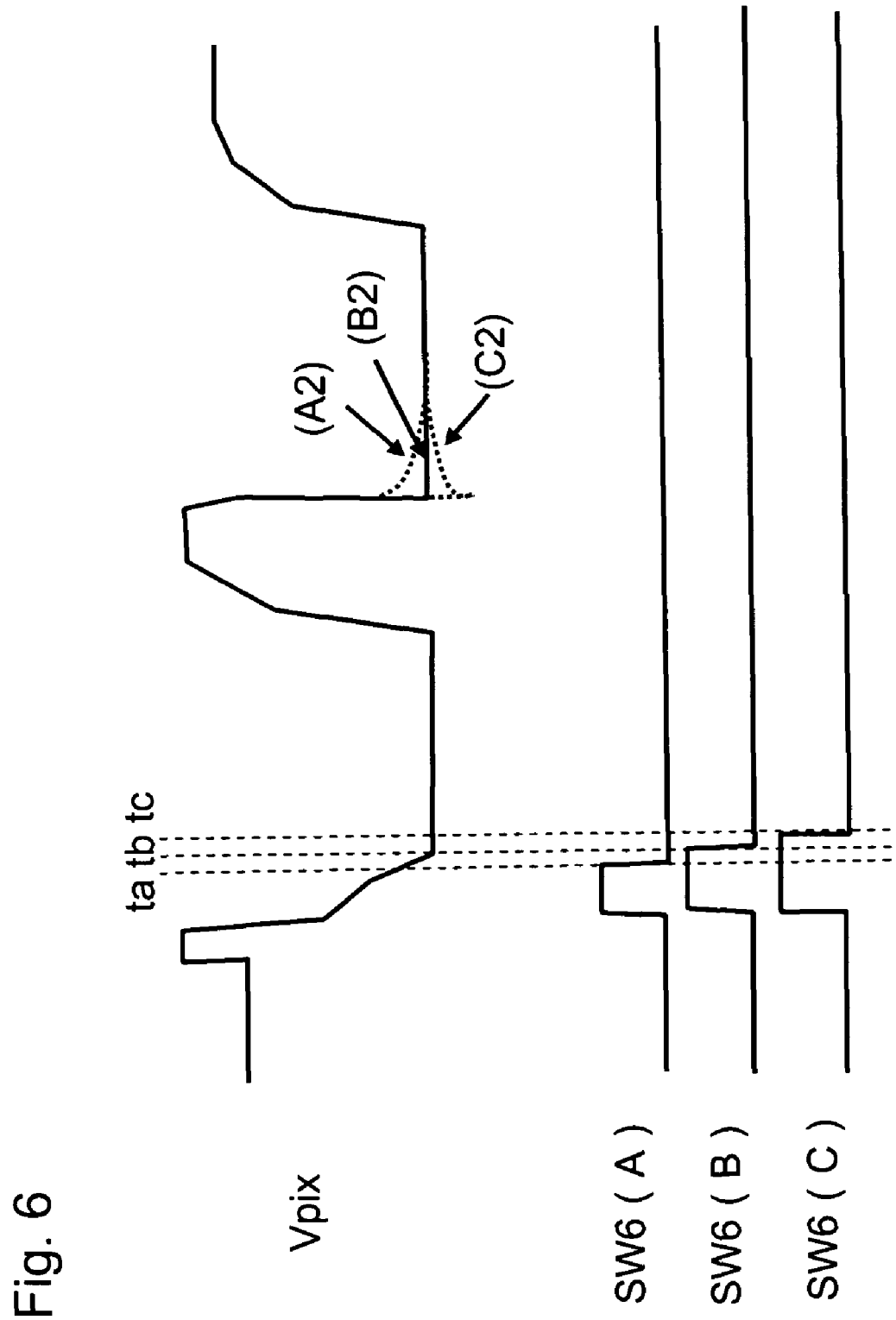
FIG. 6 is a diagram describing the A/D converter according to Embodiment 1 of the present invention, illustrating a relationship between a timing of a control signal for applying an initial voltage for a pixel signal level and a waveform of a pixel signal.

Similar to the aforementioned switch (SW5) 301e, the on and off controlling of the switch (SW6) 301f for applying the initial voltage Vis for a pixel signal level is performed by making a change as illustrated in FIG. 6 with the control signals SW6 (A2), SW6 (B2) and SW6 (C2), and the timing for switching off the switch (SW6) 301f by each signal is defined to be ta, tb and tc. That is, the time when the second sampling capacitance (C2) 302b is charged with the initial voltage Vis for a signal level, is changed. Subsequently, at a time t9, when the switch SW4 is switched on and one terminal Nb of the second sampling capacitance is short-circuited with the read out signal line L, the electric potential (pixel signal) Vpix of the pixel signal line is transitionally changed as respective voltage waveforms (A2), (B2) and (C2).

That is, in a case where the sixth switch 301f is switched off at the timing illustrated with the control signal SW6 (B), it is defined to be the time when the pixel signal voltage Vpix is exactly equal to the pixel reset level Vrst, when the switch (SW4) 301d is subsequently switched on. If so, the switch is switched off in the voltage waveform (A2) at a timing earlier than in the voltage waveform (B2). Therefore, when the switch (SW4) 301d is switched on thereafter, the pixel signal voltage Vpix is stabilized from the higher voltage side to the pixel reset level Vrst. In contrast, the switch is switched off in the signal waveform (C2) at a timing later than the off timing in the signal waveform (B2), the pixel signal voltage Vpix is stabilized gradually from the lower voltage side to the pixel reset level Vrst when the switch (SW4) 301d is switched on thereafter.

In either case, the pixel signal voltage Vpix is once set to an initial voltage close to the pixel reset level Vrst and is subsequently settled, thereby stabilization is made to the pixel reset level Vrst in a very short period of time. An ideal voltage value of the aforementioned initial voltage (Vis) for a pixel signal level will be later described.

Next, at a time t6, the switch SW1 is switched off, and subsequently, the auto-zero switch (SW3) 301c of the comparing circuit is switched off. As a result, a voltage difference (Vrst−Vth) between the pixel reset level Vrst and a reverse level (threshold value) Vth of the comparing circuit is retained in the first sampling capacitance (C1) 302a.

In addition, at a time t7, a transfer gate (TX) of the pixel is turned on, so that an electric charge is transferred from the photodiode (PD) to the floating diffusion (FD) and the voltage of the floating diffusion (FD) is decreased. However, in the case of a dark period as illustrated in FIG. 3, the voltage of the floating diffusion (FD) is increased owing to capacitance coupling of the transfer gate (TX) and the floating diffusion (FD), and the voltage of the pixel signal Vpix is increased simultaneously.

At a time t8, the transfer gate (TX) is turned off, so that the voltage of the pixel signal Vpix is decreased.

At a time t9, the switch (SW4) 301d is switched on for controlling the input of the pixel signal Vpix to sample the pixel signal level Vsig of the sample hold circuit, so that the voltage of the terminal Nb, which is one terminal connected to the fourth switch (SW4) 301d, becomes the voltage (Vd) set forth in the equation (1) below.

$$Vb = \frac{Cpix}{Cpix + Cad} \cdot Vpix(t9) + \frac{Cad}{Cpix + Cad} \cdot Vis \quad Vb \approx Vrst \quad (1)$$

wherein:
Vrst denotes a pixel reset level voltage;
Vir denotes a reference initial voltage for a pixel reset level (Vir≈Vrst);
Vis denotes a reference initial voltage for a pixel signal level;
Vpix (t9) denotes a voltage Vpix at a time t9 (>Vrst);
Cpix denotes a total load capacitance of a pixel input terminal (Vpix) side of a switch SW4;
Cad denotes a total load capacitance of a terminal Nb side of a switch SW4; and
Vb denotes a voltage of a terminal Nb immediately after the switch SW4 is switched on.

In the equation (1) described above, Vrst is substituted for Vb to solve the equation for the initial voltage Vis for a pixel signal level. When a determined voltage value is defined to be the initial voltage Vis for a pixel signal level, the pixel signal Vpix is set to a voltage near the pixel reset level Vrst when the switch (SW4) 301d is switched on. In general, since the additional capacitance Cpix on the pixel side is greater than an additional capacitance on the A/D converter side, it is desirable for the initial voltage Vis for a pixel signal level to be a low voltage close to the ground (0V).

Note that the initial voltage Vis in the above equation (1) is, to be exact, a voltage at the terminal (Nb) at the time t9.

Next, at a time t10, the switch (SW4) 301d is switched off, the switch being for controlling the input of the pixel signal Vpix, during a period for sampling the pixel signal level Vsig. As a result, a voltage difference (Vsig−Vr0) between the pixel signal level Vsig and the initial level Vr0 of the ramp wave is retained at the second sampling capacitance (C2) 302b.

Next, at a time t11, the horizontal line selecting signal SEL, which is a pixel driving signal, is turned off, so that the pixel signal Vpix is returned to its initial voltage level. Finally, at a time t12, the switch (SW2) 301b is switched on, the switch being for controlling the input of the ramp wave signal, so that the ramp wave signal Vr is input to the comparing section 3A2 via the sample hold circuit 3A1 in the A/D converter, and an A/D conversion is started.

Note that the A/D conversion in the comparing section 3A2 and the memory circuit is performed similarly as that in the conventional solid-state image capturing apparatus.

Figure 11:
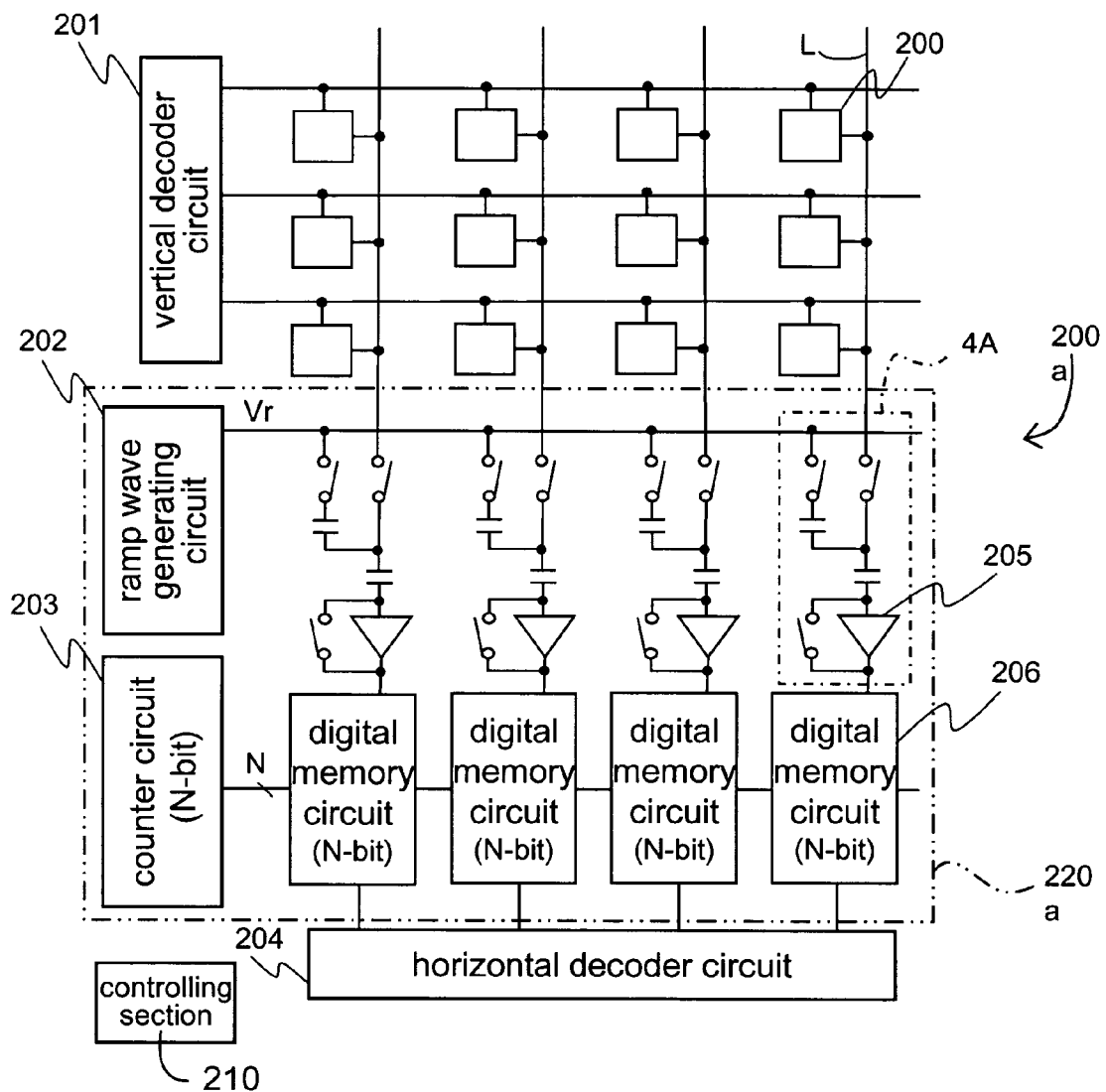
FIG. 11 is a diagram illustrating a system configuration of a CMOS image sensor including a conventional A/D converter.
Figure 12:
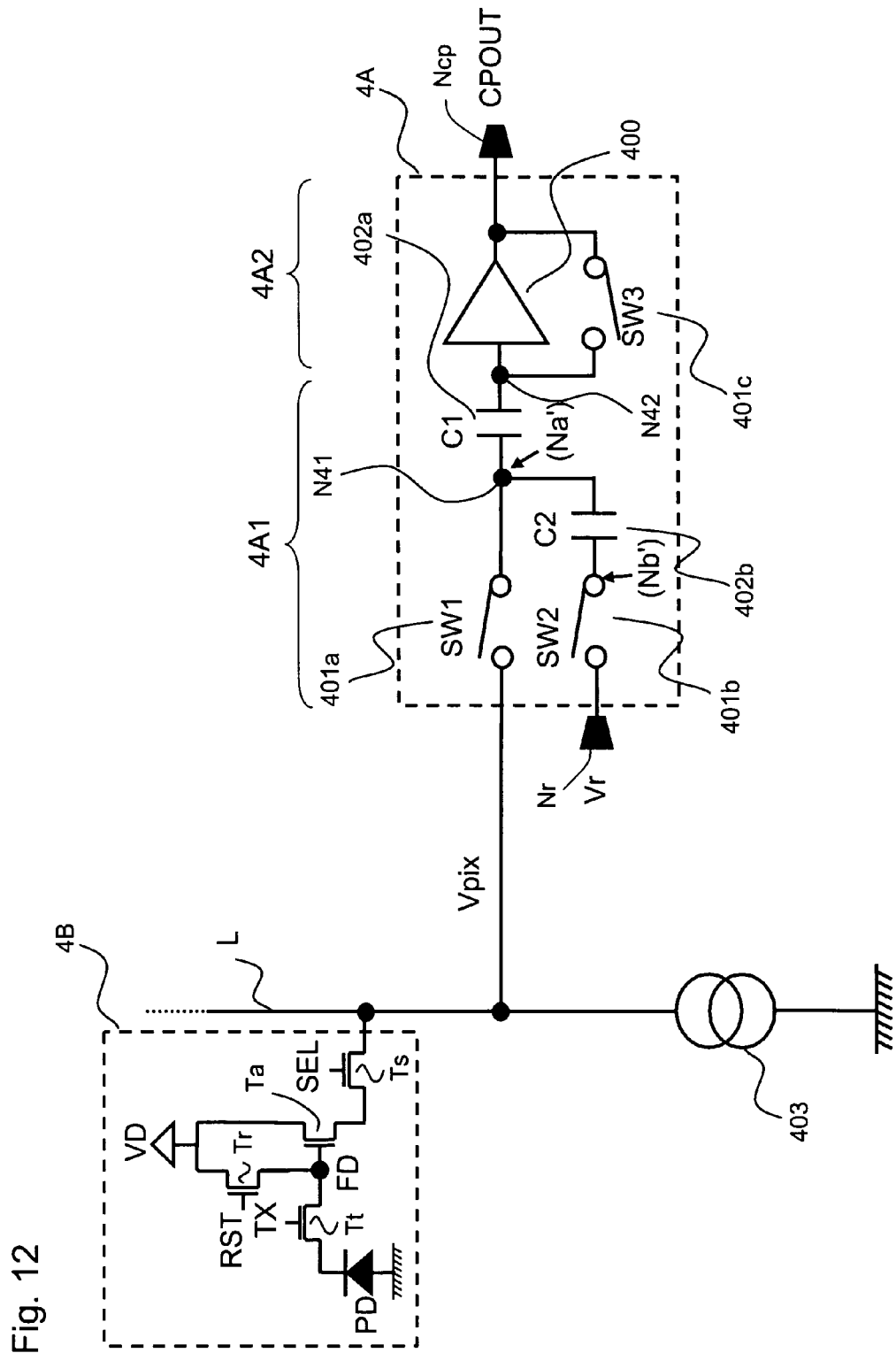
FIG. 12 is a diagram illustrating a configuration of a sample hold circuit and comparing circuit section in a conventional A/D converter.

In a case where both a reset sampling period Trs and a signal sampling period Tss are extremely short times, when the timing diagram of the A/D converter of the conventional technique illustrated in FIG. 11 is compared with the timing diagram of the A/D converter of the present invention illustrated in FIG. 3, it is understood that, in the present invention, the pixel signal (Vpix) is stabilized in an extremely short period of time.

Figure 13:
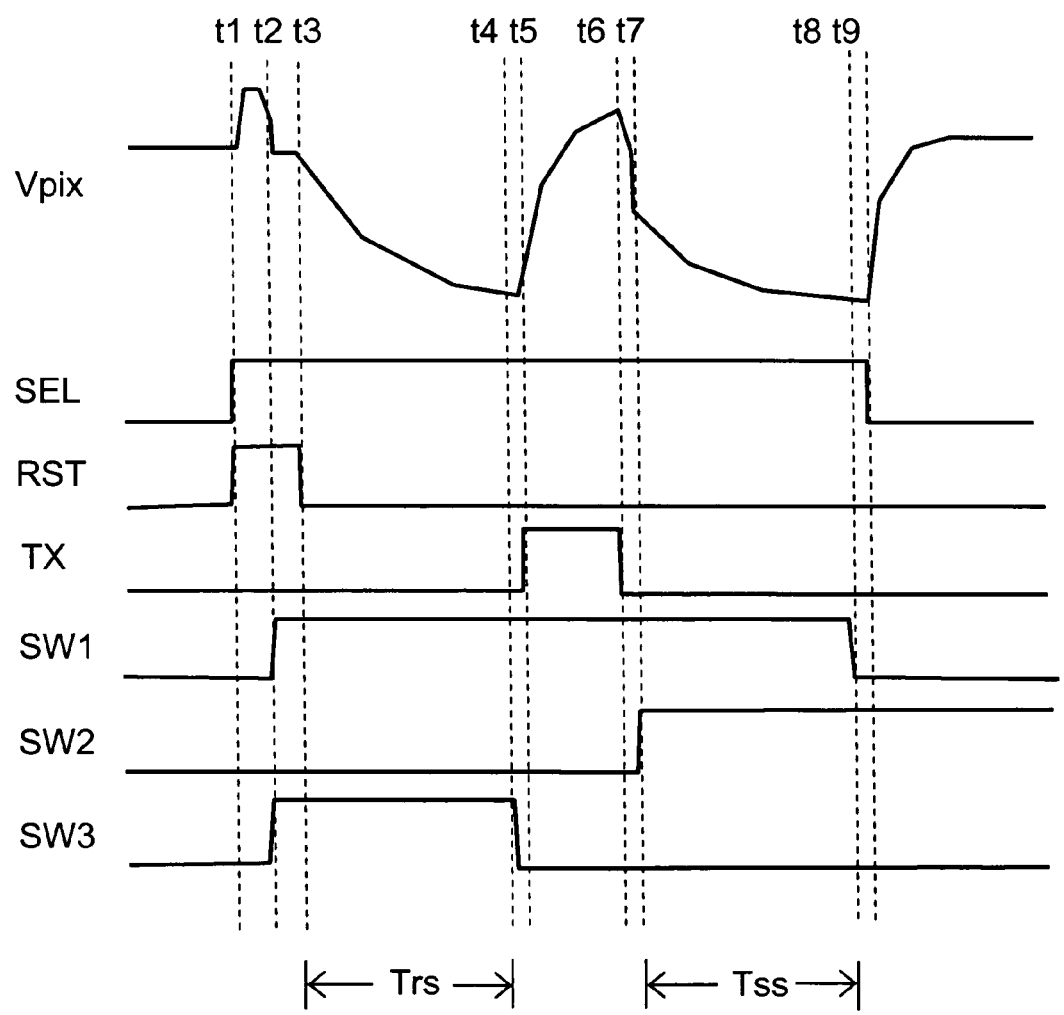
FIG. 13 is a diagram describing an operation of a conventional A/D converter using a timing diagram.
Figure 14:
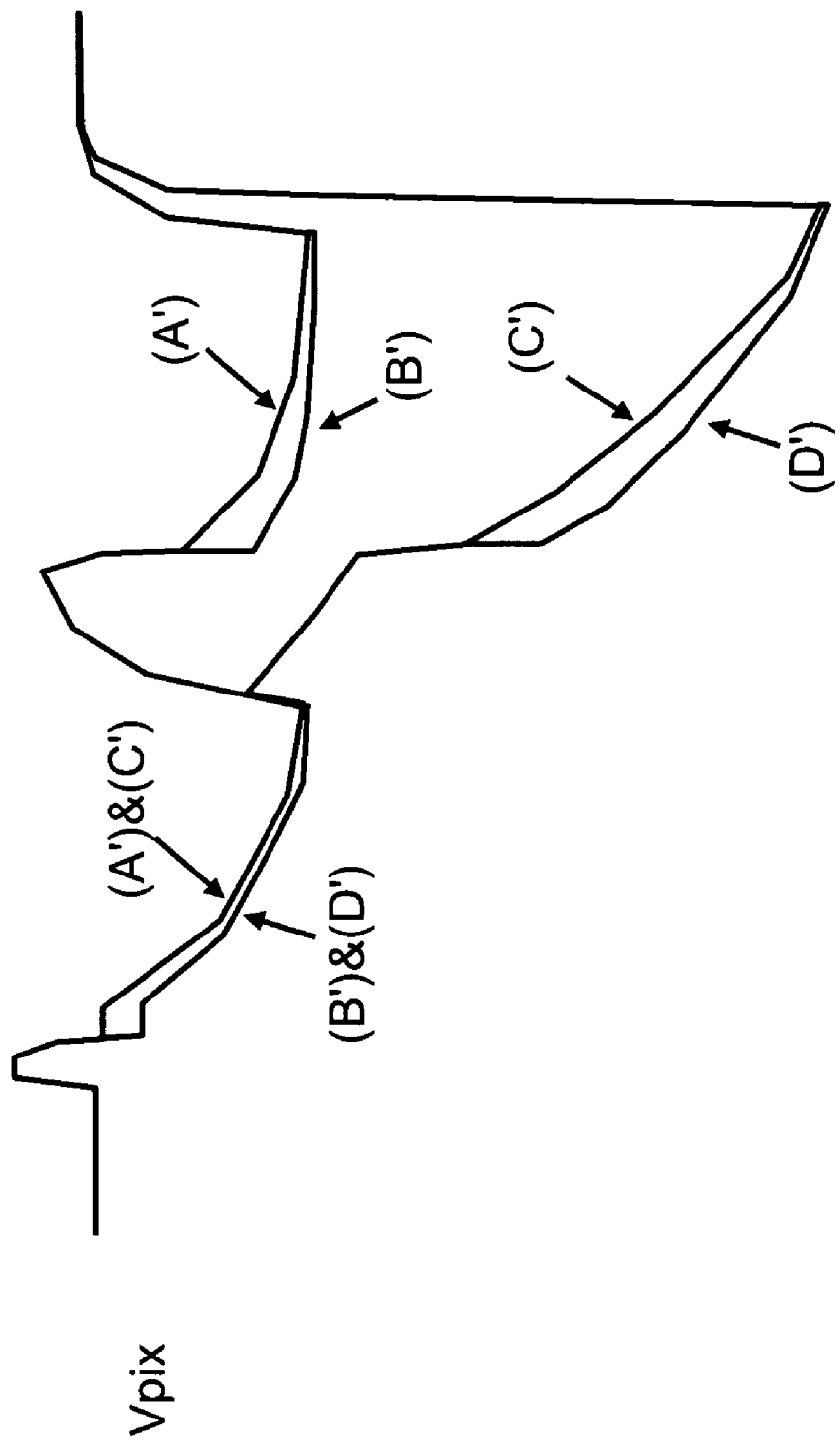
FIG. 14 is a diagram illustrating a detailed waveform of an input signal being input from a pixel to a sample hold circuit and comparing circuit section in a conventional A/D converter.
Figure 15:
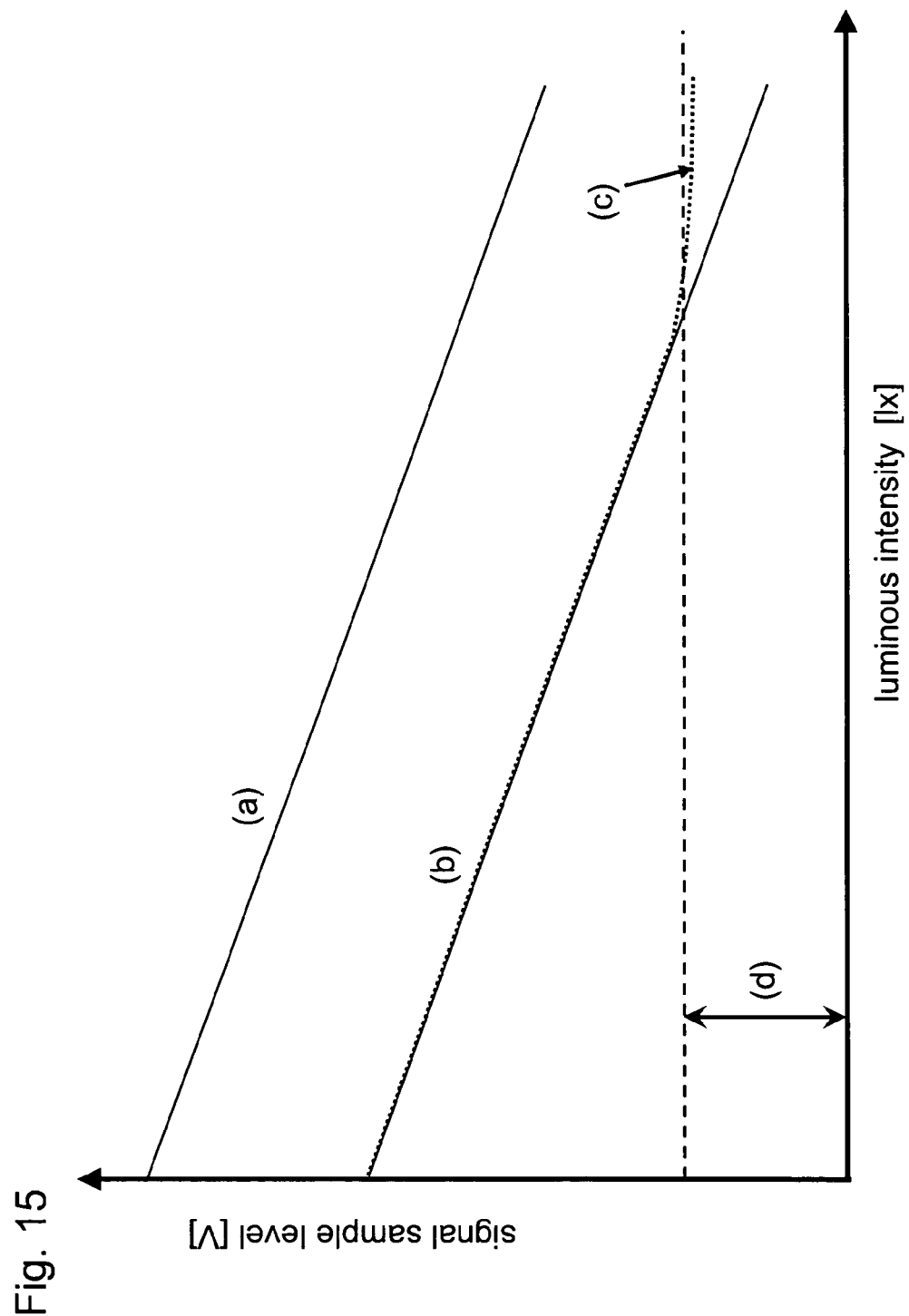
FIG. 15 is a diagram illustrating a linearity of a typical relationship between the amount of light and a signal sample level.

That is, in the timing diagram of the A/D converter of the conventional technique illustrated in FIG. 13, in a case where both the reset sampling period Trs and the signal sampling period Tss are extremely short periods of time, the pixel signal Vpix is not sufficiently settled. Compared to this, in the timing diagram of the A/D converter of the present invention illustrated in FIG. 3, the pixel signal (Vpix) is settled in an extremely short period of time.

In addition, in the aforementioned timing diagram of the A/D converter of the present invention (FIG. 3), since the same operation is repeated in each horizontal period, the terminal Na and terminal Nb in the sample hold circuit 3A1 of the A/D converter are respectively set to the initial voltage Vir for a reset level and the initial voltage Vis for a signal level in each pixel read out period.

The change of the pixel signal Vpix therefore does not depend on the amount of light of a pixel that is read out in a previous time, but the change accurately reflects the amount of light of the pixel that is read out in a present time.

Figure 4:
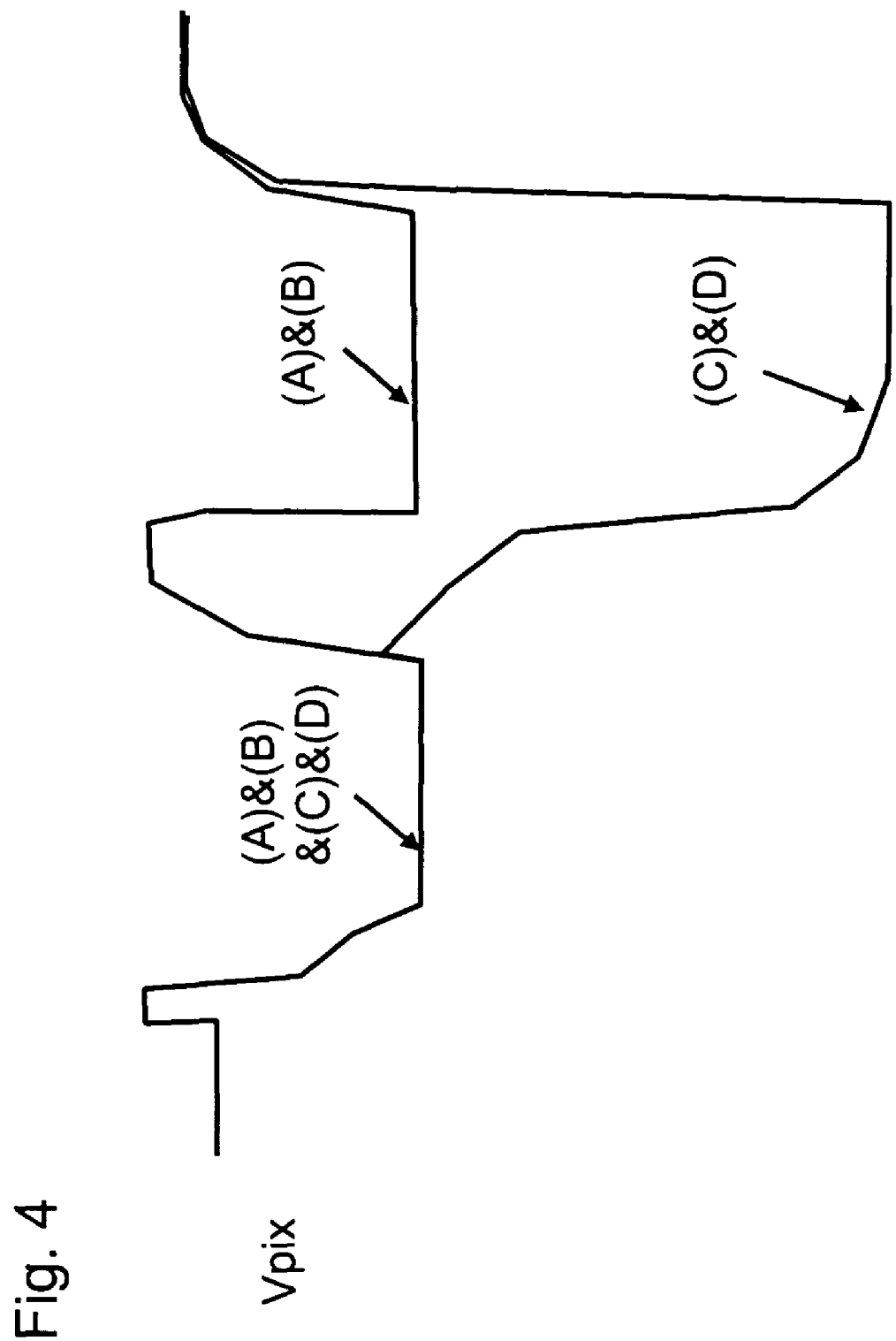
FIG. 4 is a diagram describing the A/D converter according to Embodiment 1 of the present invention, illustrating detailed waveforms of an input signal being input from a pixel into the sample hold circuit and comparing circuit section.

FIG. 4 is a diagram illustrating detailed waveforms of a pixel signal (Vpix) in the A/D converter of the present invention.

In FIG. 4, a waveform (A) represents a waveform illustrating change in the pixel signal Vpix in a case where a previous pixel read out was during a dark period and a present pixel read out is also during a dark period. Further, a waveform (B) represents a waveform of a case where a previous pixel read out was during a bright period and a present pixel read out is during a dark period. When the waveforms (A) and (B) of the pixel signal Vpix are compared with each other, they correspond to each other in both sampling of the reset level Vrst and sampling of the signal level Vsig.

Similarly, a waveform (C) in FIG. 4 is a waveform illustrating change in the pixel signal Vpix in a case where a previous pixel read out was during a dark period and a present pixel read out is during a bright period. Further, a waveform (D) in FIG. 4 is a waveform illustrating change in the pixel signal Vpix in a case where a previous pixel read out was during a dark period and a present pixel read out is during a bright period. A waveform (D) in FIG. 4 is a waveform illustrating change in the pixel signal Vpix in a case where a previous pixel read out was during a bright period and a present pixel read out is also during a bright period.

When the waveforms (C) and (D) of the pixel signal Vpix are compared with each other, they correspond to each other in both sampling of the reset level Vrst and sampling of the signal level Vsig.

Still further, the switch (SW4) 301d is switched on in a state where the terminal Nb in the sample hold circuit of the A/D converter of the present invention illustrated in FIG. 2 is set to the initial electric potential Vis for a signal level, which is a very low voltage, so that the settling is suitable and stabilization is made to the signal level Vsig in a short period of time, compared to the conventional technique, even in the operation during a bright period.

Therefore, according to the solid-state image capturing apparatus, represented by a CMOS image sensor, including the A/D converter of the present invention, it becomes possible to achieve an image sensor capable of not only reading out the pixel signal Vpix in a short period of time, but also converting light into a digital value accurately with low noise via the voltage value of the pixel signal Vpix.

The following effects can be obtained in Embodiment 1 with the configuration described above.

The A/D converter 120a according to Embodiment 1 includes: a sample hold section 3A1 for retaining an analog input signal voltage to be converted into digital data, and a ramp wave signal voltage changing at a step corresponding to a bit number in the digital data; a comparing section 3A2 for taking only an output from the sample hold section as an input to compare it with a reverse level (a threshold value) of itself; and a digital memory circuit 106 corresponding to the bit number, for taking an output of the comparing section as an input and storing an A/D conversion result when the comparison result of the comparing section is changed. The sample hold circuit includes a first capacitance element 302a for sample holding a first voltage level of the analog input signal, and one terminal of the capacitance element is an input terminal N32 of the comparing section. For the other terminal (Na) N31, a switch (SW5) 301e is provided for controlling a connection between a terminal Nr1 for applying a first initial voltage and the terminal (Na) N31. Accordingly, it becomes possible to perform a first initial voltage setting for the terminal (Na) N31.

In addition, in the sample hold section 3A1 included in the A/D converter 120a according to Embodiment 1, the initial voltage Vir for the reset level applied to the terminal (Na) N31 has a voltage value very close to the first voltage level (reset level) to which the voltage level of the analog input signal is transitionally stabilized. As a result, by application of the initial voltage to the terminal N31, the voltage of the terminal is compulsorily set to near the first voltage level and is subsequently settled. That is, when the analog input signal is applied to the terminal (Na) N31 from the pixel signal line, the electric potential of the terminal (Na) N31 is stabilized to the first voltage level at a fast rate. Therefore, even if a period Trs for the sample hold section 3A1 to sample the first voltage level of the analog input signal is short, the first voltage level is precisely sampled.

In addition, in the sample hold section 3A1 included in the A/D converter 120a according to Embodiment 1, the period for the switch (SW5) 301e is switched on is set to be variable, the switch (SW5) 301e being for controlling a period for applying voltage to the terminal (Na) N31. Further, the on-period of the switch (SW5) 301e is controlled so that the switch (SW5) 301e is switched off when the voltage of the terminal (Na) N31 becomes a voltage value very close to a voltage level at which the first voltage level (reset level) of the analog input signal is transitionally stabilized. Thereby, optimization is enabled to sample hold the first voltage level of the analog input signal in a shorter period of time.

In addition, in the sample hold section 3A1 included in the A/D converter 120a according to Embodiment 1, the second capacitance element (C2) 302b is further included for sample holding the second voltage level (pixel signal level) of the analog input signal, and one terminal Nr0 of the capacitance element is an input terminal of the ramp wave signal Vr. For the other terminal (Nb) N33, the switch (SW4) 301d is provided for controlling a connection between the input terminal of the analog input signal and the terminal (Nb). Thereby, voltage setting can be performed independently on the aforementioned terminal (Na) N31 and terminal (Nb) N33.

In addition, in the sample hold section 3A1 included in the A/D converter 120a according to Embodiment 1, for the terminal (Nb) N33, the switch SW6 is provided for controlling a connection between the terminal Nr2, for applying the second initial voltage Vis, and the terminal (Nb) N33. Thereby, the second initial voltage setting can be performed on the terminal (Nb) N33.

In addition, in the sample hold section 3A1 included in the A/D converter 120a according to Embodiment 1, the initial voltage Vis for the signal level is applied to the terminal (Nb) N33 so that, when the switch SW4 is switched on, the voltage level of the terminal (Nb) N33 becomes the voltage value which is very close to the transitionally stabilized first voltage level of the analog input signal, the voltage level of the terminal (Nb) N33 being stabilized after electric charge distribution. As a result, the voltage level of the terminal (Nb) N33 is set to near the first voltage level and is subsequently settled when the switch (SW4) 301d is switched on. That is, when the switch (SW4) 301d is switched on, the voltage level of the terminal (Nb) N33 is stabilized to the first voltage level at a fast rate. Therefore, even if the period Tss for the sample hold section 3A1 to sample the second voltage level of the analog input signal is short, the second voltage level can be precisely sampled. The second voltage level mentioned herein is defined to be a voltage level equal to or below the first voltage level.

Further, in the sample hold section 3A1 included in the A/D converter 120a according to Embodiment 1, a period for the switch (SW6) 301f to be switched on is set to be variable, the switch (SW6) 301f controlling a period for applying a voltage to the terminal (Nb) N33. Further, the on-period of the switch (SW6) 301f is controlled so that when the switch (SW4) 301d is switched on at a time t9, the voltage level of the terminal (Nb) N33, which is stabilized after electric charge distribution, becomes a voltage value very close to the first voltage level, which is transitionally stabilized. Thereby, optimization is possible to sample hold the second voltage level of the analog input signal in a shorter period of time.

(Embodiment 2)

Figure 7:
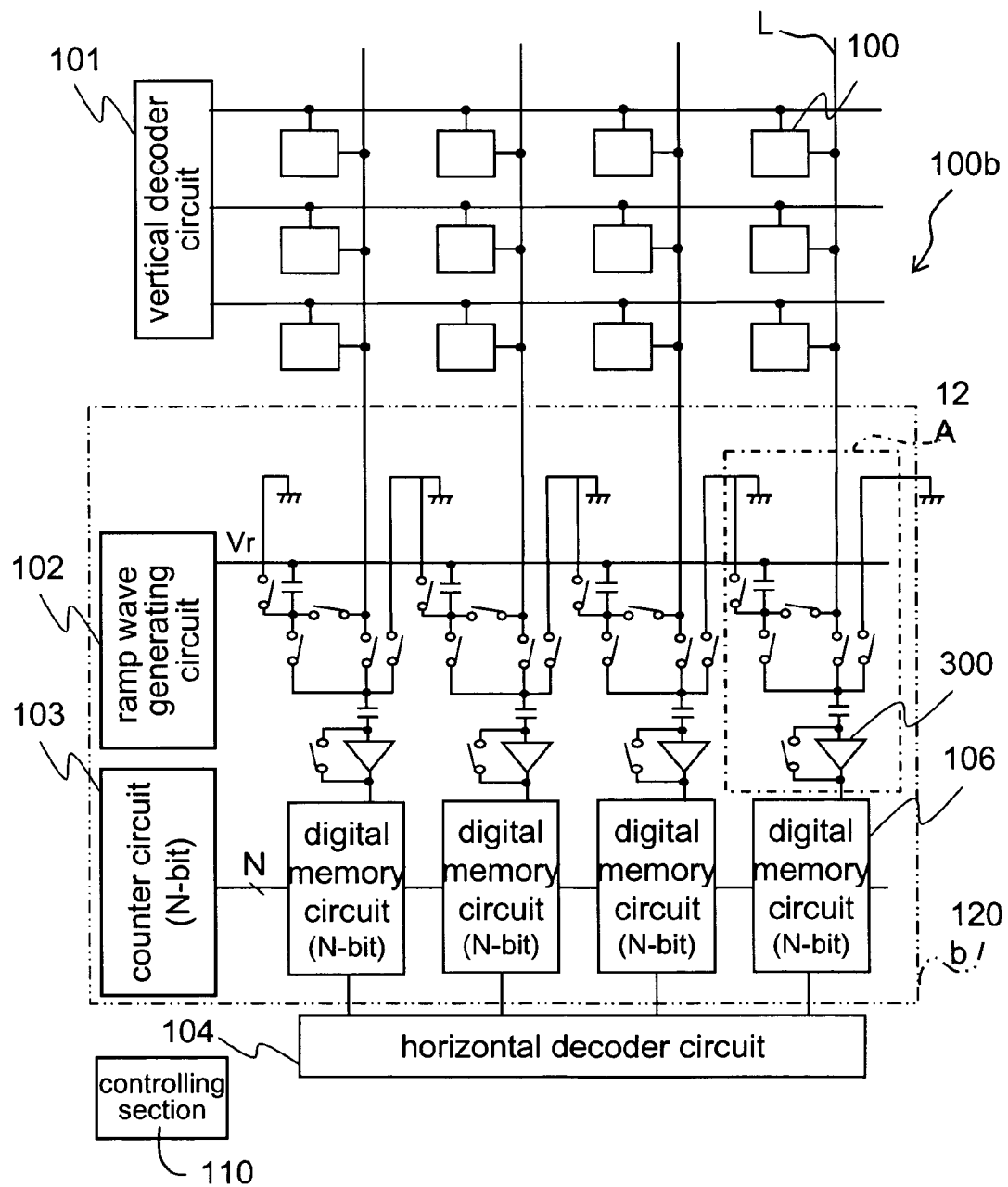
FIG. 7 is a diagram illustrating a system configuration of a CMOS image sensor including an A/D converter according to Embodiment 2 of the present invention.
Figure 8:
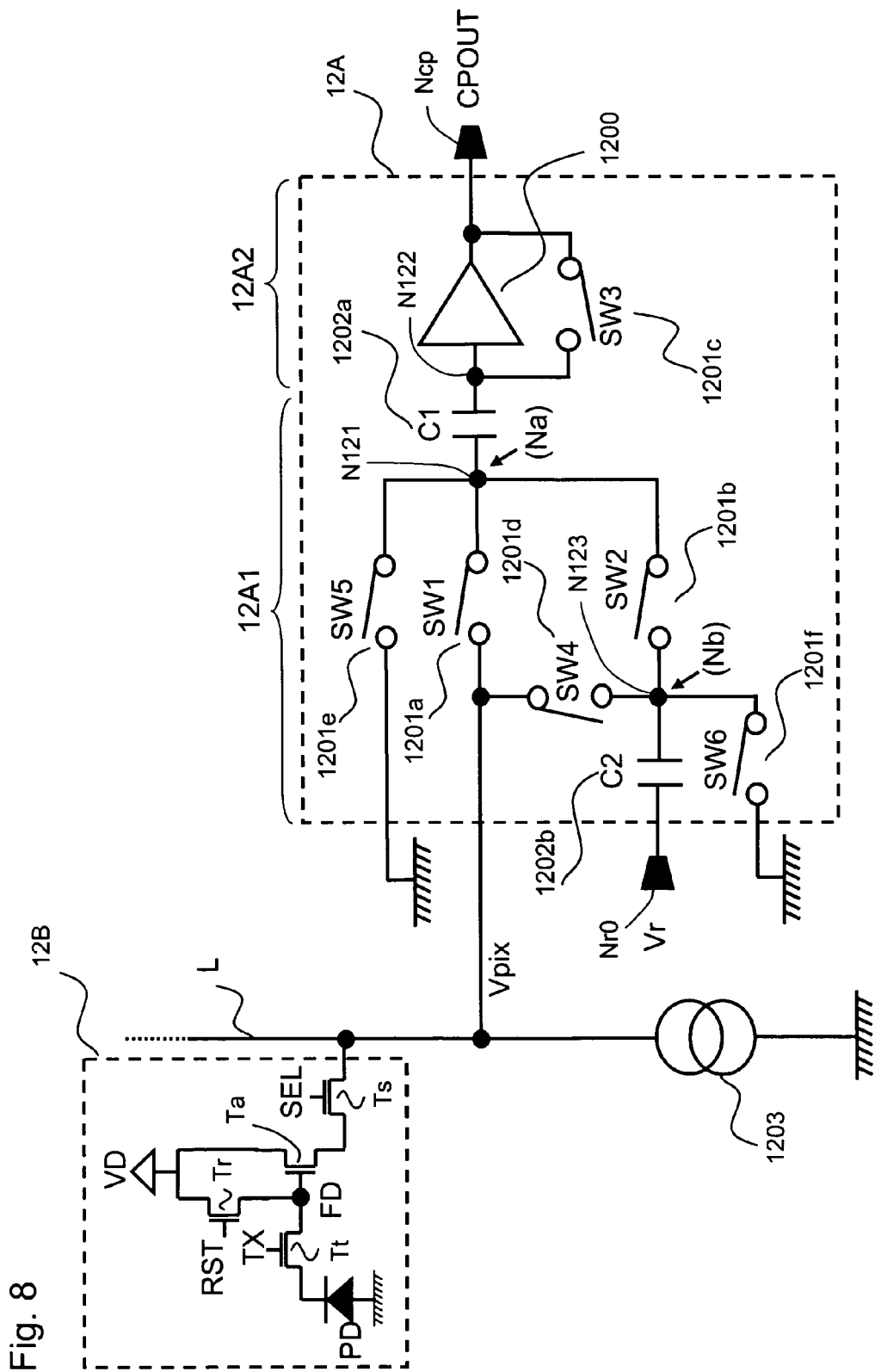
FIG. 8 is a diagram describing an A/D converter in a solid-state image capturing apparatus according to Embodiment 2 of the present invention, illustrating a sample hold circuit and comparing circuit section in the A/D converter together with a configuration of a pixel.

FIG. 7 is a diagram describing a solid-state image capturing apparatus according to Embodiment 2 of the present invention, illustrating specific elements of a sample hold circuit and comparing circuit section constituting an A/D converter in the solid-state image capturing apparatus. FIG. 8 is a diagram describing an A/D converter in the solid-state image capturing apparatus according to Embodiment 2 of the present invention, illustrating a sample hold circuit and comparing circuit section in the A/D converter together with a configuration of a pixel.

In the A/D converter according to Embodiment 2, and further in a sample hold circuit and comparing circuit section (SHC circuit section) 12A therein, a sample hold circuit 12A1 includes: two capacitance elements 1202a and 1202b (hereinafter, each one of them will be referred to as C1 and C2); and five switches 1201a, 1201b, 1201d, 1201e and 1201f (hereinafter, the respective switches will be referred to as SW1, SW2, SW4, SW5 and SW6). In addition, a comparing section 12A2 in the SHC circuit section 12A includes: a chopper type single input comparing circuit 1200; and a switch 1201c (hereinafter, referred to as SW3) for short-circuiting an input and output of the single input comparing circuit 1200.

The sample hold circuit and comparing circuit section 12A of the A/D converter according to Embodiment 2 is different from the sample hold circuit and comparing circuit section 3A (FIG. 3) in that the two reference voltages Vir and Vis, used by the sample hold circuit to read out a signal from the pixel fast, are both grounded in the case of the A/D converter according to Embodiment 2.

This configuration brings an effect of reducing an area for laying out a column-parallel A/D converter and an effect of reducing a chip area and power consumption since it is no longer necessary to use the reference voltage generating circuit 107 for generating two reference voltages (Vir and Vis) in FIG. 1, in which a system configuration is illustrated for a CMOS image sensor including the A/D converter according to Embodiment 1.

Instead of the sample hold circuit and comparing circuit section 3A in the solid-state image capturing apparatus according to Embodiment 1, the solid-state image capturing apparatus according to Embodiment 2 uses the sample hold circuit and comparing circuit section 12A, which uses the reference voltages Vir and Vis as a ground voltage.

Therefore, a pixel circuit 12B in the solid-state image capturing apparatus according to Embodiment 2 has an identical configuration as that of the pixel circuit 3B in the solid-state image capturing apparatus 100a according to Embodiment 1.

In addition, the sample hold circuit and comparing circuit section 12A in the solid-state image capturing apparatus according to Embodiment 2 includes: a switch 1201a connected between a first internal node N121 and the read out signal line L; a capacitor (C1) 1202a connected between the first internal node N121 and a second internal node N122; a switch 1201b connected between the first internal node N121 and a third internal node N123; a capacitor 1202b connected between the third internal node N123 and a ramp signal input terminal Nr0; a switch 1201f connected between the third internal node N123 and a ground potential; a switch 1201e connected between the first internal node N121 and the ground potential; and a switch 1201d connected between the third internal node N123 and the read out signal line L.

In addition, the comparing section includes: a single input comparing circuit 1200 connected between the second internal node N122 and a comparison output node Ncp; and a switch 1201c connected in parallel with the comparing circuit 1200.

In a solid-state image capturing apparatus 100b herein, an A/D converter 120b is constituted of the SHC circuit section 12A, a digital memory circuit 106, a counter circuit 103, and a ramp wave generating circuit 102.

Herein, for explanatory reasons, the first to sixth switches (SW1 to SW6) 1201a to 1201f are controlled by control signals SW1 to SW6, and these control signals are supplied from a controlling section 110 together with a pixel driving signal.

Figure 9:
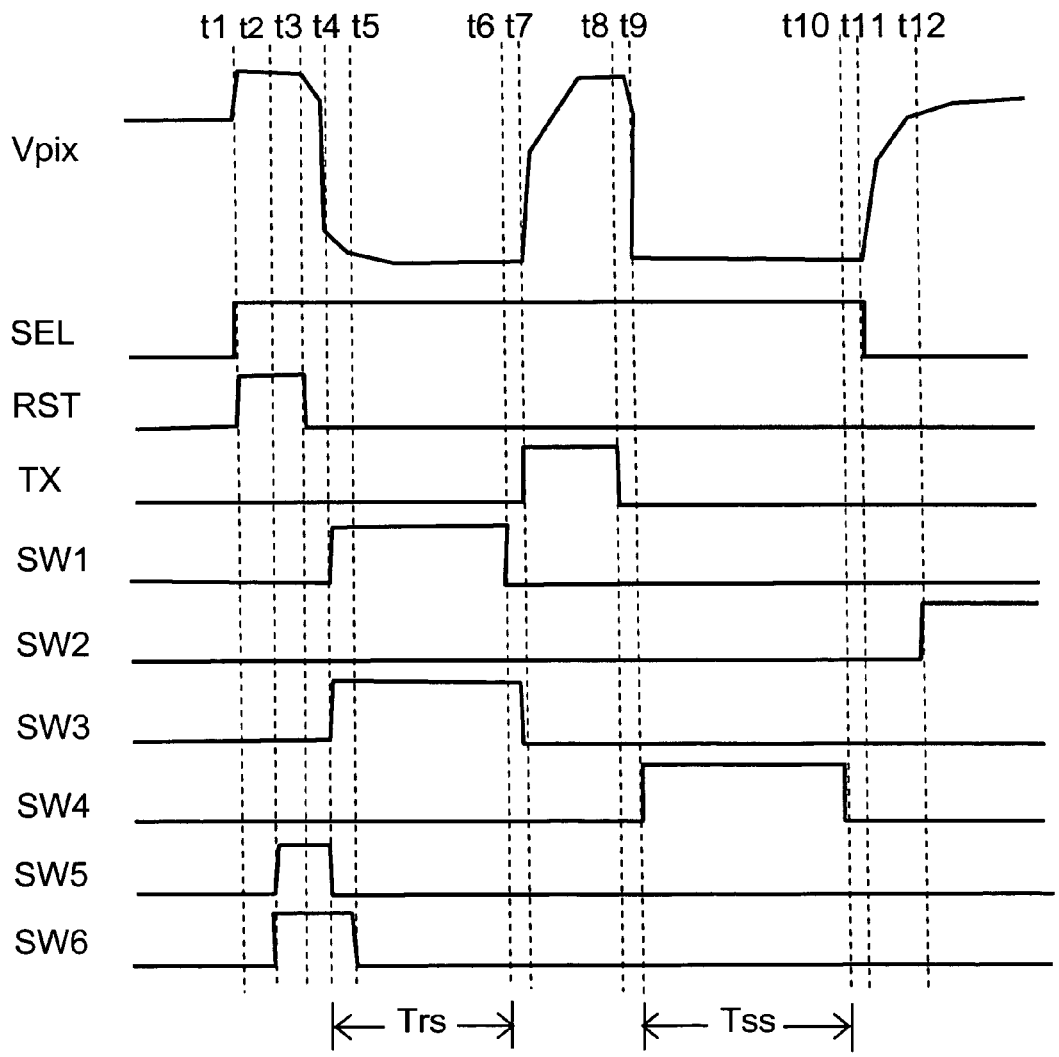
FIG. 9 is a diagram describing an operation of an A/D converter according to Embodiment 2 of the present invention using a timing diagram.

Next, the operation of the circuit illustrated in FIG. 8 will be described in detail with reference to the timing diagram in FIG. 9.

Note that the description will be provided only with regard to the difference from the timing diagram of the A/D converter according to Embodiment 1 of the present invention, illustrated in FIG. 3.

In the timing diagram of the A/D converter according to Embodiment 1 of the present invention illustrated in FIG. 63, the switch (SW1) for controlling the input of the pixel signal Vpix of the sample hold circuit and the auto-zero switch (SW3) of the comparing circuit are switched on at the time t2. On the other hand, in the timing diagram of the A/D converter 120b according to Embodiment 2 of the present invention illustrated in FIG. 9, the switch (SW1) 1201a and switch (SW3) 1201c are switched on at a time t4.

The reasons for the above operation are that the initial electric potential Vir for a pixel reset level is grounded and that the pixel signal Vpix will be set to a voltage by far lower than the pixel reset level Vrst if the switch (SW1) 1201a is switched on during a period for which the switch (SW5) 1201a is switched on for applying the initial voltage Vir for a reset level.

That is, since it is necessary to switch on the switch (SW1) 1201a after the switch (SW5) 1201e is switched off, the timing for switching off the switch 1201a is delayed to the time t4. Since a reset level sampling period for a pixel starts at the time t4, the substantial period of time is shortened.

In the timing diagram of the A/D converter according to Embodiment 1 of the present invention illustrated in FIG. 3, it is impossible to obtain the function of rapidly stabilizing the floating diffusion (FD) owing to a parasitic capacitance between the pixel signal Vpix and floating diffusion (FD) and the effect provided by the function.

In addition, when the switch (SW1) 1201a, for controlling the input of the pixel signal Vpix, is switched on during a period for sampling the pixel reset level Vir of the sample hold circuit at the time t4, the voltage of one terminal (Na) N121 of the first sampling capacitance (C1) 1202a, the terminal being connected to the switch (SW1) 1201a, becomes a voltage (Va) as set forth in the following equation (2).

$$Va = \frac{Cpix}{Cpix + Cad} \cdot Vpix(t4) + \frac{Cad}{Cpix + Cad} \cdot Vir \quad Va \approx Vrst \quad (2)$$

wherein:
Vrst denotes a pixel reset level voltage;
Vir denotes a reference initial voltage for a pixel reset level (Vir≈Vrst);
Vis denotes a reference initial voltage for a pixel signal level;
Vpix (t4) denotes a voltage of Vpix at a time t4 (>Vrst);
Cpix denotes a total load capacitance of a pixel input terminal (Vpix) side of a switch SW1;
Cad denotes a total load capacitance of a terminal Na side of a switch SW1; and
Va denotes a voltage of a terminal Na immediately after the switch SW1 is switched on.

In the equation (2) described above, Vrst is substituted for Va to solve the equation for the initial voltage Vir for a pixel reset level. Accordingly, in the case where a determined voltage is defined to the initial voltage Vir for reset, when the switch (SW1) 1201a is switched on, the pixel signal Vpix is set to a voltage near the pixel reset level Vrst.

In general, as previously described, since the additional capacitance Cpix on the pixel side is greater than an additional capacitance on the A/D converter side, it is desirable for the initial voltage Vir for a pixel reset level to be a low voltage close to the ground (0V), as similar to the initial voltage Vis for a pixel signal level. Note that the initial voltage Vir in the above equation (2) is, to be exact, a voltage at the terminal (Na) at the time t4.

In Embodiment 2 with the configuration described above, the following effects can be obtained in addition to the effects in Embodiment 1.

In the sample hold circuit 12A1 included in the A/D converter 120b according to Embodiment 2, a terminal for applying the first initial voltage to the terminal Na is fixed to a ground. Therefore, the first initial voltage is not necessary to be applied from the outside. As a result, a reference voltage generating circuit is not necessary for the first initial voltage, thereby achieving effects of reducing power consumption and reducing a layout area of the A/D converter.

In addition, in the sample hold circuit 12A1 included in the A/D converter 120b according to Embodiment 2, a terminal for applying the second initial voltage to the terminal Nb is grounded. Therefore, as similar to the above description, the second initial voltage is not necessary to be applied from the outside. As a result, a reference voltage generating circuit is not necessary for the second initial voltage, thereby achieving effects of reducing power consumption and reducing a layout area of the A/D converter.

In Embodiments 1 and 2, although the comparing circuit, which constitutes the comparing section, is a single input comparing circuit for taking, as an input, an output from only the sample hold circuit to compare it with a reverse level (a threshold value) of itself, the comparing circuit is not limited to this. For example, the comparing circuit, which constitutes the comparing section, may be a two input comparing circuit for taking the output from the sample hold circuit and the ramp wave signal as inputs.

In addition, in Embodiments 1 and 2, although the initial voltage is supplied to the first and second sampling capacitance elements, the initial voltage may be supplied to only either of the first and second sampling capacitance elements. That is, it is possible to supply an initial voltage (stabilization promoting voltage) Vir to the first sampling capacitance element and not to supply an initial voltage (stabilization promoting voltage) Vis to the second sampling capacitance element. Alternatively, it is also possible not to supply the initial voltage (stabilization promoting voltage) Vir to the first sampling capacitance element, but to supply the initial voltage (stabilization promoting voltage) Vis to the second sampling capacitance element.

Further, although not specifically described in Embodiments 1 and 2 described above, an electronic information device having an image input device will be described hereinafter. The electronic information device, such as a digital camera (e.g., digital video camera and digital still camera), an image input camera, a scanner, a facsimile machine and a camera-equipped cell phone device, includes an image capturing section using at least one of the solid-state image capturing apparatuses according to Embodiments 1 and 2 described above.

(Embodiment 3)

Figure 10:
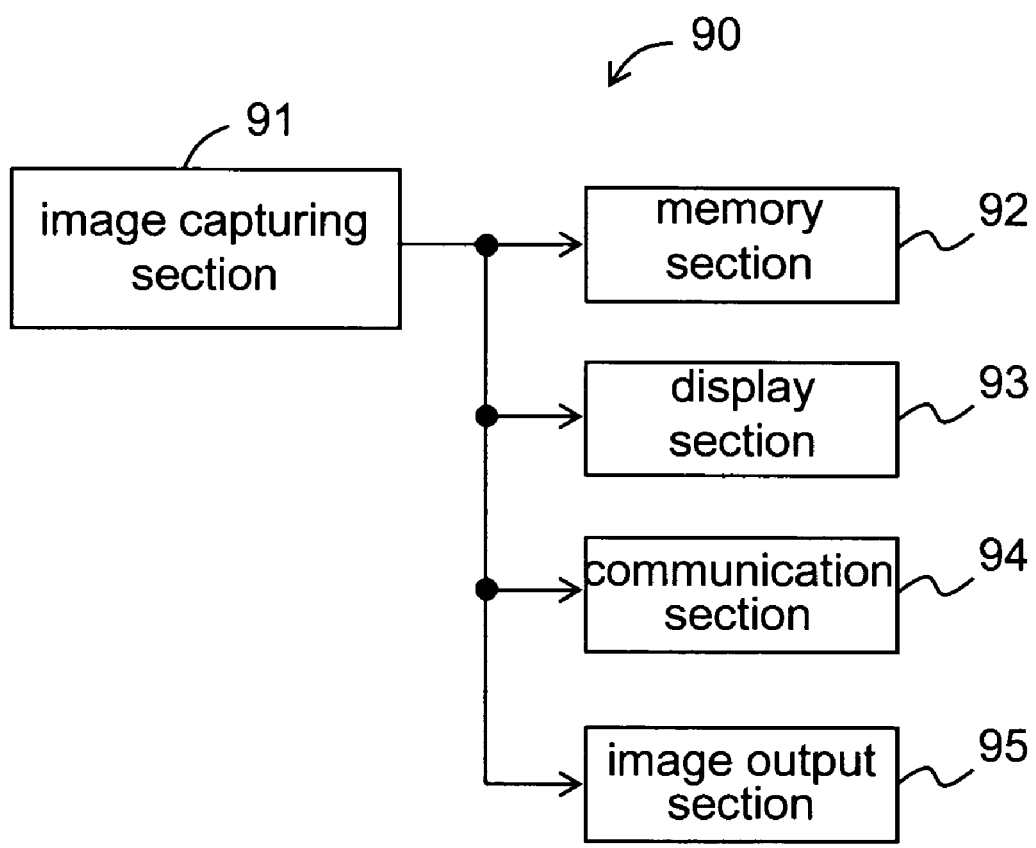
FIG. 10 is a block diagram schematically illustrating an exemplary configuration of an electronic information device as Embodiment 3 of the present invention, including the solid-state image capturing apparatus according to Embodiment 1 or 2 used in an image capturing section thereof.

FIG. 10 is a block diagram schematically illustrating an exemplary configuration of an electronic information device as Embodiment 3 of the present invention, including the solid-state image capturing apparatus according to Embodiment 1 or 2 used in an image capturing section thereof.

The electronic information device 90 according to Embodiment 3 of the present invention as illustrated in FIG. 10 includes either of the solid-state image capturing apparatuses according to Embodiments 1 and 2 of the present invention as an image capturing section 91 for capturing a subject. The electronic information device 90 further includes at least any of: a memory section 92 (e.g., recording media) for data-recording a high-quality image data obtained by being captured by an image capturing section, after predetermined signal processing is performed on the image data for recording; a display section 93 (e.g., liquid crystal display device) for displaying this image data on a display screen (e.g., liquid crystal display screen) after predetermined signal processing is performed for display; a communication section 94 (e.g., transmitting and receiving device) for communicating this image data after predetermined signal processing is performed on the image data for communication; and an image output section 95 for printing (typing out) and outputting (printing out) this image data.

As described above, the present invention is exemplified by the use of its preferred Embodiments. However, the present invention should not be interpreted solely based on Embodiments described above. It is understood that the scope of the present invention should be interpreted solely based on the claims. It is also understood that those skilled in the art can implement equivalent scope of technology, based on the description of the present invention and common knowledge from the description of the detailed preferred Embodiments of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of an A/D converter for converting an analog signal to digital data, a solid-state image capturing apparatus including the A/D converter, and further an electronic information device using the solid-state image capturing apparatus therein. According to the present invention, it is possible to obtain: a solid-state image capturing apparatus, represented by a CMOS image sensor, capable of shortening a sampling period of each of a reset level and a signal level to shorten a total pixel read out period and accurately performing an A/D conversion on light at a fast frame rate, without largely increasing its occupying area and while maintaining a low noise picture quality; and an electronic information device including the solid-state image capturing apparatus used therein.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An A/D converter, comprising a comparing section for comparing a voltage level of an analog input signal with a voltage level of a ramp wave signal incrementally changing by a constant voltage range, for converting the voltage level of the analog input signal into digital data on the basis of a comparison result of the comparing section, the A/D converter further comprising a sample hold section, which includes at least one capacitance element as a sampling capacitance element, and is configured so that, when the analog input signal is applied to a terminal of the sampling capacitance element, the voltage level of the analog input signal is sample held by the sampling capacitance element, wherein the sample hold section applies a stabilization promoting voltage to the terminal of the sampling capacitance element so as to promote a stabilization in which an electric potential level of the terminal of the sampling capacitance element is stabilized towards a predetermined voltage when the analog input signal is applied to the terminal of the sampling capacitance element.

2. An A/D converter according to claim 1, wherein:

the sample hold section includes at least two capacitance elements as first and second sampling capacitance elements, and is configured such that a first voltage level of the analog input signal is sample held by the first sampling capacitance element when the analog input signal is applied to a terminal of the first sampling capacitance element, and a second voltage level of the analog input signal is sample held by the second sampling capacitance element when the analog input signal is applied to a terminal of the second sampling capacitance element;

the comparing section is configured to compare a difference voltage level between the first voltage level and the second voltage level of the analog input signal with the voltage level of the ramp wave signal;

the digital data is obtained by performing A/D conversion on the difference voltage level; and when the analog input signal is applied to a terminal of at least one of the first and second sampling capacitance elements of the sample hold section, the stabilization promoting voltage is applied to the terminal of the at least one sampling capacitance element so that the electric potential level of the at least one terminal of the sampling capacitance element is promoted to become stabilized.

3. An A/D converter according to claim 2, wherein:

the analog input signal is an analog pixel signal from a pixel, which constitutes a solid-state image capturing apparatus and which performs a photoelectric conversion on and outputting light from a subject; and the first voltage level of the analog input signal is a reset voltage level, which is a reference electric potential of the pixel, and the second voltage level of the analog input signal is a signal voltage level obtained by the photoelectric conversion in the pixel.

4. An A/D converter according to claim 3, wherein when the analog input signal is applied to a terminal of the first sampling capacitance element of the sample hold section, a first initial voltage, as the stabilization promoting voltage, is applied to the terminal of the first sampling capacitance element so that the electric potential level of the terminal of the first sampling capacitance element is promoted to become stabilized to the reset voltage level.

5. An A/D converter according to claim 3, wherein when the analog input signal is applied to a terminal of the second sampling capacitance element of the sample hold section, a second initial voltage, as the stabilization promoting voltage, is applied to the terminal of the second sampling capacitance element so that the electric potential level of the terminal of the second sampling capacitance element is promoted to become stabilized to the signal voltage level.

6. An A/D converter according to claim 3, wherein:

when the analog input signal is applied to a terminal of the first sampling capacitance element of the sample hold section, a first initial voltage, as the stabilization promoting voltage, is applied to the terminal of the first sampling capacitance element so that the electric potential level of the terminal of the first sampling capacitance element is promoted to become stabilized to the reset voltage level; and when the analog input signal is applied to a terminal of the second sampling capacitance element of the sample hold section, a second initial voltage, as the stabilization promoting voltage, is applied to the terminal of the second sampling capacitance element so that the electric potential level of the terminal of the second sampling capacitance element is promoted to become stabilized to the signal voltage level.

7. An A/D converter according to claim 2, wherein the sample hold section is a sample hold circuit for retaining a voltage level of the analog input signal to be converted into the digital data and a ramp wave signal voltage incrementally changing in level at a step corresponding to a bit number in the digital data.

8. An A/D converter according to claim 7, wherein the comparing section is a single input comparing circuit for taking, as an input, only an output from the sample hold circuit to compare the input with a threshold value of the section itself.

9. An A/D converter according to claim 7, wherein the comparing section is a two input comparing circuit for taking an output from the sample hold circuit and the ramp wave signal voltage as inputs.

10. An A/D converter according to claim 7, wherein a first terminal of the first sampling capacitance element is an input node of the comparing section, and the sample hold section includes a first switch connected between a first initial voltage terminal, to which the first initial voltage is applied as the stabilization promoting voltage, and a second terminal of the first sampling capacitance element.

11. An A/D converter according to claim 10, wherein the stabilization promoting voltage applied to a second terminal of the first sampling capacitance element has a voltage value very close to a first voltage level, towards which the voltage level of the analog input signal is transitionally stabilized.

12. An A/D converter according to claim 10, wherein an on-period of the first switch is controlled such that the first switch is switched off when a voltage level of a second terminal of the first sampling capacitance element becomes a voltage value very close to a first voltage level, toward which the voltage level of the analog input signal is transitionally stabilized.

13. An A/D converter according to claim 7, wherein a first terminal of a second sampling capacitance element is an input terminal of the ramp wave signal, and the sample hold section includes a second switch connected between an input terminal applied with the analog input signal and a second terminal of the second sampling capacitance element.

14. An A/D converter according to claim 13, further including a third switch connected between a second initial voltage terminal applied with a second initial voltage as the stabilization promoting voltage, and the second terminal of the second sampling capacitance element.

15. An A/D converter according to claim 14, wherein the second initial voltage is set so that, when the second switch is switched on, the voltage level being stabilized after electric charge distribution, of the second terminal of the second sampling capacitance element becomes a voltage level very close to the transitionally stabilized first voltage level of the analog input signal.

16. An A/D converter according to claim 14, wherein the on-period of the third switch is controlled by switching off the third switch so that, when the second switch is switched on, a voltage level being stabilized after electric charge distribution, of the second terminal of the second sampling capacitance element becomes a voltage value very close to the transitionally stabilized first voltage level of the analog input signal.

17. An A/D converter according to claim 2, wherein a first initial voltage terminal for applying a first initial voltage to a second terminal of the first sampling capacitance element is fixed at a ground level.

18. An A/D converter according to claim 2, wherein a second initial voltage terminal for applying a second initial voltage to a second terminal of the second sampling capacitance element is fixed at ground level.

19. A solid-state image capturing apparatus including the A/D converter according to claim 1.

20. An electronic information device including an image capturing section for capturing an image of a subject, wherein the image capturing section includes a solid-state image capturing apparatus according to claim 19.

* * * * *